(12) United States Patent
Kizer et al.

(10) Patent No.: US 7,081,782 B2
(45) Date of Patent: Jul. 25, 2006

(54) LOCKED LOOP WITH DUAL RAIL REGULATION

(75) Inventors: Jade M. Kizer, Mountain View, CA (US); Benedict C. Lau, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/130,682

(22) Filed: May 17, 2005

(65) Prior Publication Data

US 2005/0206419 A1    Sep. 22, 2005

Related U.S. Application Data

(63) Continuation of application No. 10/104,230, filed on Mar. 22, 2002, now Pat. No. 6,911,853.

(51) Int. Cl.
*H03L 7/06* (2006.01)

(52) U.S. Cl. ............................ 327/158; 327/161
(58) Field of Classification Search ............... 327/2, 327/143–144, 146–149, 151–153, 156–158, 327/160–161; 331/25, 17, DIG. 2; 375/373, 375/375, 376
See application file for complete search history.

(56) References Cited

U.S. PATENT DOCUMENTS

2001/0033630 A1    10/2001    Hassoun et al. ............ 375/376

*Primary Examiner*—Linh My Nguyen
(74) *Attorney, Agent, or Firm*—Vierra Magen; Marcus & DeNiroLLP

(57) ABSTRACT

An apparatus having a dual rail regulated reference loop. The reference loop includes a delay circuit powered by upper and lower supply voltages to generate a plurality of reference clock signals, and a voltage regulation circuit to adjust the upper and lower supply voltages according to a phase difference between a selected pair of the reference clock signals.

18 Claims, 14 Drawing Sheets

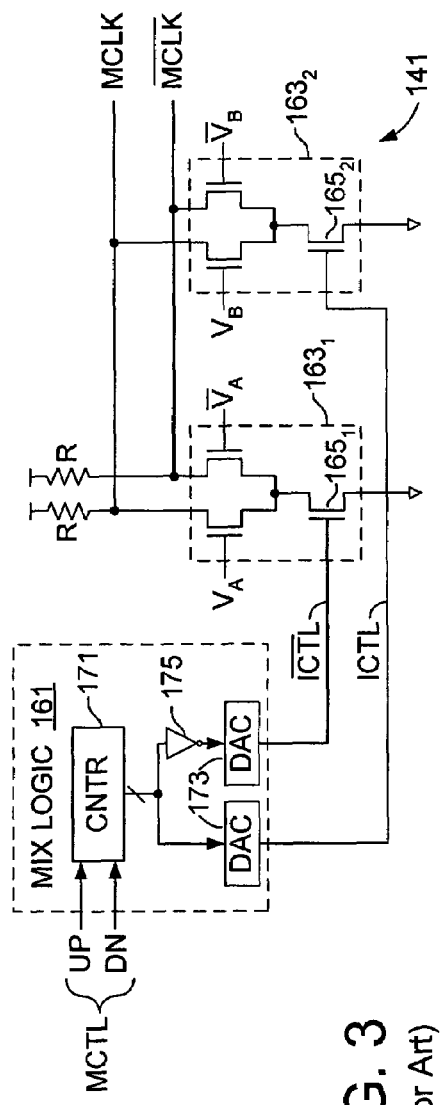
FIG. 3
(Prior Art)
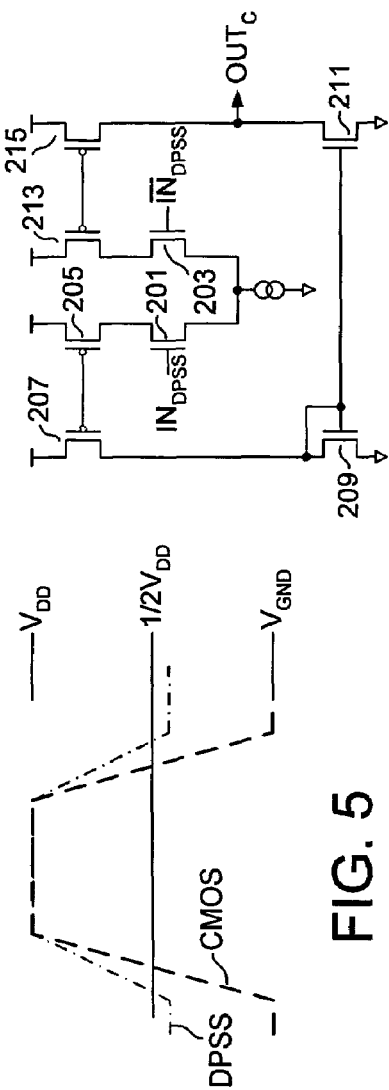
FIG. 5
(Prior Art)
FIG. 6
(Prior Art)
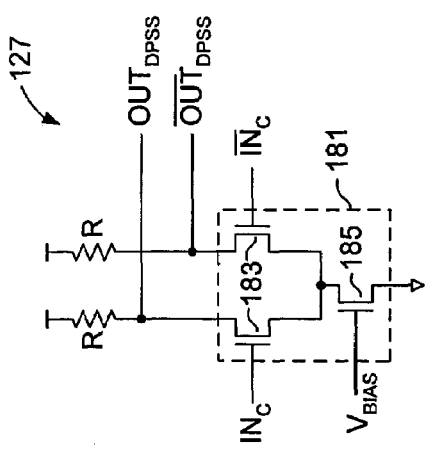
FIG. 4
(Prior Art)

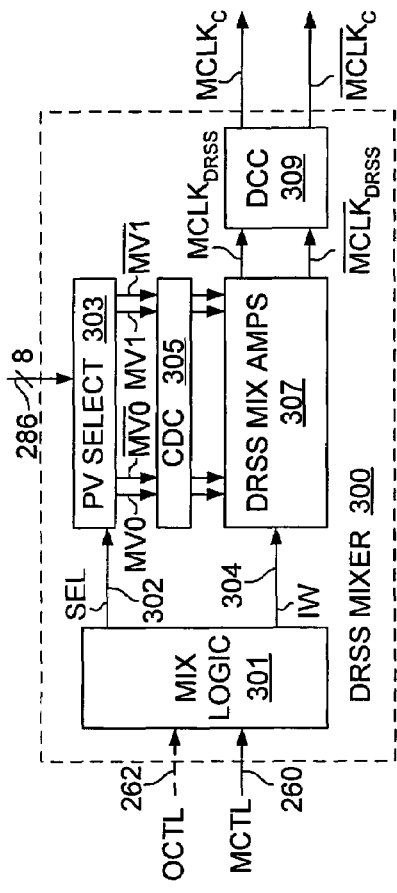
FIG. 9
FIG. 8
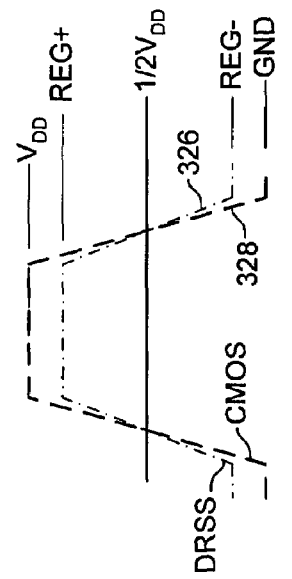
FIG. 11
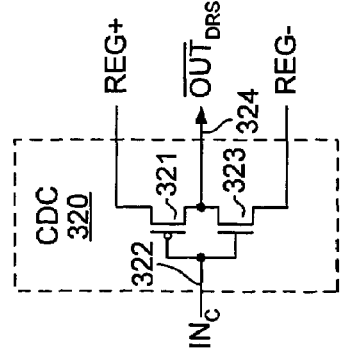
FIG. 10
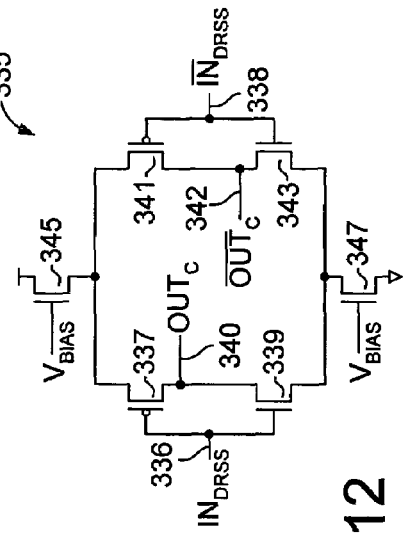
FIG. 12

| OSEL | S1 | S2 | S3 | S4 | MV0 | MV1 | $\overline{MV0}$ | $\overline{MV1}$ | IW INC |
|---|---|---|---|---|---|---|---|---|---|
| 0 0 0 | 0 | 0 | 0 | 0 | $V_0$ | $V_1$ | $\overline{V_0}$ | $\overline{V_1}$ | $0 \rightarrow 2^N-1$ |
| 0 0 1 | 1 | 0 | 0 | 0 | $V_2$ | $V_1$ | $\overline{V_2}$ | $\overline{V_1}$ | $2^N-1 \rightarrow 0$ |
| 0 1 0 | 1 | 1 | 0 | 0 | $\overline{V_0}$ | $V_3$ | $\overline{V_2}$ | $\overline{V_3}$ | $0 \rightarrow 2^N-1$ |
| 0 1 1 | 0 | 1 | 1 | 0 | $\overline{V_0}$ | $\overline{V_3}$ | $V_0$ | $V_3$ | $2^N-1 \rightarrow 0$ |
| 1 0 0 | 0 | 0 | 1 | 1 | $\overline{V_2}$ | $\overline{V_1}$ | $V_2$ | $V_1$ | $0 \rightarrow 2^N-1$ |
| 1 0 1 | 1 | 1 | 1 | 1 | $\overline{V_2}$ | $\overline{V_3}$ | $V_2$ | $V_3$ | $2^N-1 \rightarrow 0$ |
| 1 1 0 | 0 | 0 | 0 | 0 | $V_0$ | $V_3$ | $\overline{V_0}$ | $V_3$ | $0 \rightarrow 2^N-1$ |
| 1 1 1 | 0 | 1 | 0 | 1 | $V_0$ | $\overline{V_3}$ | $\overline{V_0}$ | $V_3$ | $2^N-1 \rightarrow 0$ |

FIG. 17

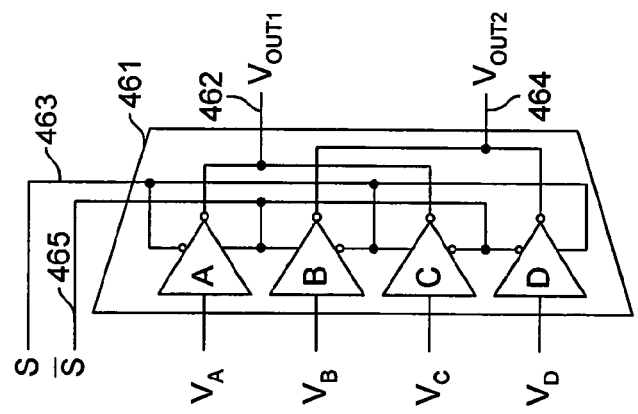

FIG. 18

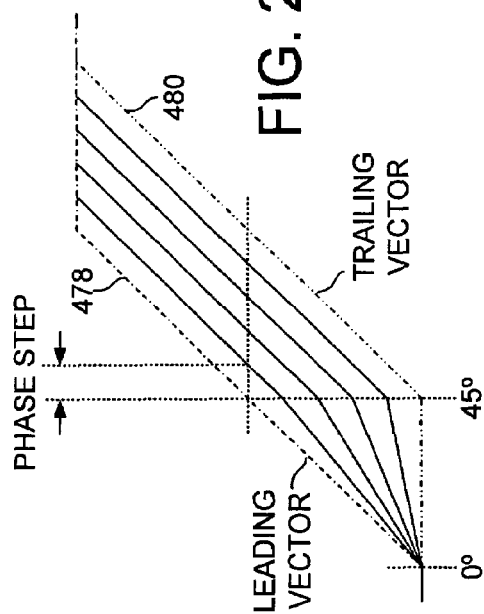
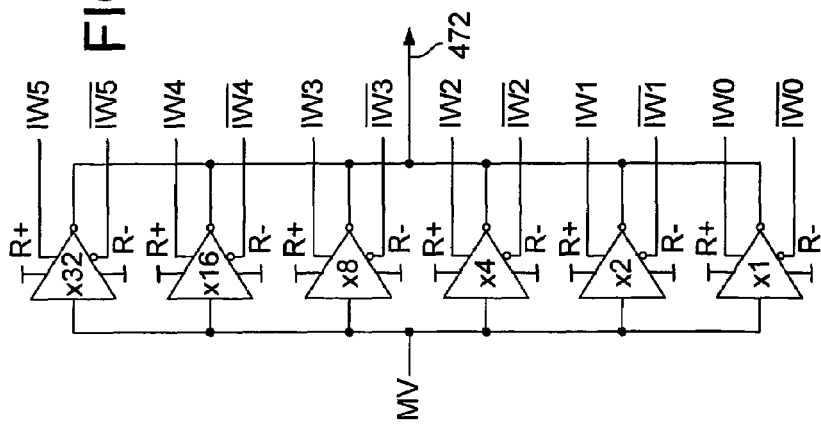
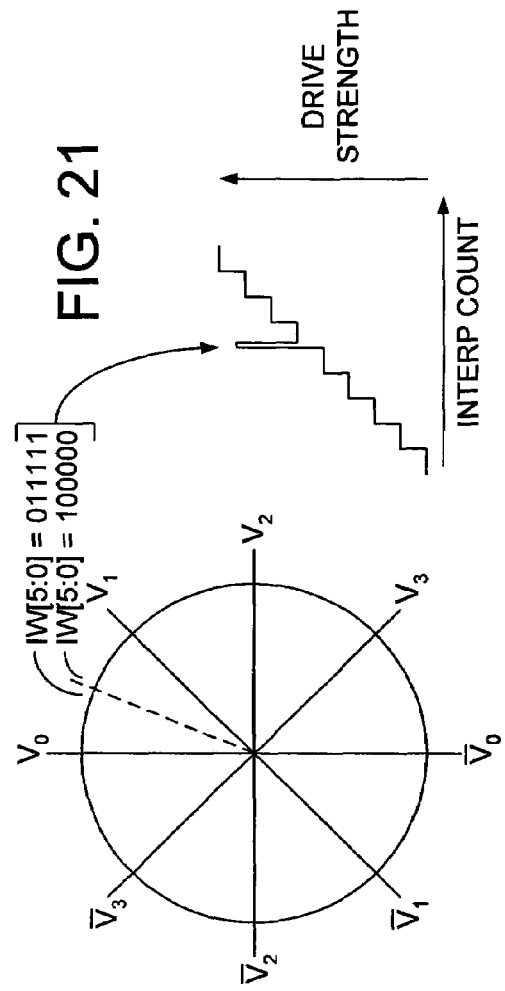

LOCKED LOOP WITH DUAL RAIL REGULATION

This is a continuation of U.S. patent application Ser. No. 10/104,230 filed on Mar. 22, 2002 now U.S. Pat. No. 6,911,853.

FIELD OF THE INVENTION

The present invention relates generally to high speed signaling within and between integrated circuit devices, and more particularly to clock generation in high-speed signaling devices and systems.

BACKGROUND

Delay locked loop (DLL) circuits are often used in high-speed signaling systems to generate clock signals having precisely controlled phase offsets relative to a reference clock. FIG. 1 illustrates one such prior art signaling system including a master device 101 coupled to a N slave devices, $103_1$–$103_N$, via a data path 102, and a clock generator 106 coupled to the master device 101 and the slave devices 103 via a clock line 104. A reference clock signal, CLK, generated by the clock generator 106 is used within the master device 101 to time the transmission of data and is used within the slave devices 103 to time data reception. In theory, the flight time (i.e., signal propagation time) of the clock signal on the clock line 104 is the same as the data flight time on the data path 102 so that a phase relationship between a clock edge passing by the master device 101 and data output by the master device is maintained as the clock edge and data arrive at the various slave devices 103. In reality, however, differences between clock and data path characteristics (e.g., parasitic capacitance, loading, etc.), however small, result in flight time differences (i.e., skew) between the clock and data signals. Because the width of a data eye (i.e., data valid interval) in high-speed signaling systems is extremely brief (e.g., 2 nanoseconds in the case of a 500 MHz symbol rate), even a small amount of skew may result in violation of setup and hold time requirements of sampling circuits within the slave devices and therefore lead to data sampling errors. Accordingly, in the prior art system of FIG. 1, DLL circuits are included within each of the slave devices to generate sampling clock signals that are aligned to the desired sampling instant for the slave device. This arrangement is shown in FIG. 1 by the detail view of slave device 103 which includes a DLL circuit 107 to generate a sampling clock (SCLK) and a sampling circuit 109 to sample data (thereby generating sampled data signal, SDATA) in response to the sampling clock.

FIG. 2 illustrates a prior art DLL circuit. The delay locked loop circuit includes a reference loop 121, a mix loop 123, and a sampling clock generator 125. The reference loop includes a level converter 127, delay line 129 and phase detector 131 which cooperate to generate incrementally delayed versions of a reference clock signal, referred to as phase vectors 122. The level converter converts the signaling level of the incoming reference clock signals (i.e., complementary clock pair, CLK and /CLK) from CMOS (complementary metal oxide semiconductor) to differential pair small swing (DPSS) signals. The DPSS-level clock signals are input to the delay line which is formed by a plurality of differential amplifier delay elements each of which introduces a phase delay according to a bias voltage, DCTL. The phase detector 131 adjusts the bias voltage DCTL as necessary to produce a total delay, through a selected set of the delay elements 133, equal to a full cycle of the reference clock signal, CLK. That is, the phase detector 131 compares a nominally zero degree phase vector with a nominally 360 degree phase vector and increases or decreases the bias voltage (thereby decreasing or increasing the delay of the delay line) according to whether the 360 degree phase vector lags or leads the 0 degree phase vector. The number of delay elements 133 in the delay line is such that each delay element introduces a 45 degree input-to-output delay when the 0 and 360 degree vectors are in phase alignment. Accordingly, the phase vectors 122 range from 0 to 315 degrees in 45 degree phase steps.

The mix loop 123 includes a mixer 141, level converter 143, clock tree circuit 145 and phase detector 147 which cooperate to generate a mix control signal, MCTL. The mixer receives the phase vectors 122 from the reference loop 121 and interpolates between a selected pair of the phase vectors to generate a mix clock signal 142. The mix clock signal 142 is converted from a DPSS signaling level to a CMOS signaling level by converter 143 is then passed through the clock tree circuit 145 (typically a series of amplifiers that enable fan out of multiple instances of the clock signal) to generate a feedback clock signal, FCLK. The phase detector 147 compares the feedback clock signal with the reference clock signal and generates the adjust signal according to which clock signal leads the other. For example, if the reference clock signal leads the feedback clock signal, the phase detector 147 signals the mixer 141 (i.e., by appropriate state of the adjust signal) to shift interpolation toward the leading one of the selected phase vectors (and away from the trailing phase vector), thereby advancing the phase of the feedback clock. Conversely, if the reference clock signal lags the feedback clock signal, the phase detector 147 signals the mixer to shift interpolation toward the trailing one of the selected phase vectors. If the reference clock still leads or lags the feedback clock signal after interpolation has been shifted completely to one of the selected phase vectors, a different pair of phase vectors (i.e., bounding an adjacent range of phase angles) is selected by the mixer 141.

The sampling clock generator 125 includes a mixer 149, converter 151 and clock tree circuit 153 that essentially mirror the operation of the mixer, converter and clock tree circuit within the mix loop 123 to generate a sampling clock signal, SCLK. The mixer 149 receives the mix control signal, MCTL, generated within the mix loop 123 and therefore, when an offset control signal, OCTL, indicates zero offset, performs the same interpolation operation on the same pair of selected vectors as the mixer 141. As the adjust signal is incremented and decremented, the mixer 149 tracks the operation of the mixer 141 such that the sampling clock signal tracks the feedback clock signal (i.e., the sampling clock signal and feedback clock signal have the same phase). The offset control value, OCTL, is a value that is added to a count maintained within the mixer 149 to provide a controlled, adjustable offset between the sampling clock and reference clock, thereby allowing correction of skew between the reference clock and a desired sampling instant.

FIG. 3 illustrates, in part, a prior art mixer 141 for mixing DPSS-level clock signals. The mixer 141 includes mix logic 161 and a number of differential amplifier circuits 163 (only two of which, $163_1$ and $163_2$, are shown in the simplified diagram of FIG. 3). The differential amplifiers 163 each receive respective pairs of complementary phase vectors and have output nodes that are pulled up through a common pair of load resistances, R. By this arrangement, the resultant mix clock signal, MCLK, will have a phase that is between the phases of the input phase vectors according to the bias voltages, ICTL and /ICTL, applied to the respective biasing transistors of the differential amplifiers 163. The mix logic 161 maintains a counter 171 that is incremented and decremented in response to the mix control signal, MCTL, and a pair of digital-to-analog converters (DACs) 173 which generate bias voltages, ICTL and /ICTL according to the count value and complement count value (generated by inverter 175), respectively. Thus, as the count value is incremented, the bias voltage ICTL is increased (increasing the gain of differential amplifier $163_2$) and bias voltage /ICTL is decreased (decreasing the gain of differential amplifier $163_1$), thereby shifting the phase of the output clock signal toward phase vector $V_B$ and away from phase vector $V_A$.

Because of the high impedance load driven by the DACs 173 (i.e., the gate terminals of biasing transistors $165_1$ and $165_2$), several cycles of the reference clock signal are typically needed for the DAC to settle and, therefore, for the mix control signal to become valid. This is a significant disadvantage of the mixer 141, as a relatively long time is typically required to perform a phase locking operation in which numerous successive phase steps are needed to reach phase lock. Also, the ability to rapidly switch between phase offsets is limited by the DAC settling time.

The presence of the DPSS-to-CMOS converter 143 at the mixer output (see FIG. 2) presents another problem. Referring to FIG. 4, which illustrates a prior art CMOS-to-DPSS converter 127, it can be seen that the DPSS-level signals used within the reference loop 121 and mixers 141 and 149 of FIG. 2 are generated by pulling down the drain terminals of transistors 183 of a differential amplifier 181 according to the states of a differential CMOS input signals, $IN_C$ and $/IN_C$. In order to produce linear conversion from CMOS to DPSS signaling levels, it is desirable for the current drawn by the biasing transistor 185 (controlled by bias voltage $V_{BIAS}$) to be as constant as possible. Accordingly, the minimum signal swing of the DPSS signals are constrained to be at least high enough to maintain the biasing transistor 185 in the linear region of operation (i.e., in saturation). Consequently, when a CMOS input signal is high, the corresponding DPSS signal is pulled down to a signal level that is substantially above the ground potential, and when the CMOS input signal is low, the DPSS signal is pulled up to the supply voltage level, $V_{DD}$. That is, as shown in FIG. 5, the DPSS signal swing is asymmetric with respect to the midpoint of the CMOS signal swing (i.e., $V_{DD}/2$).

The asymmetric swing of the DPSS signal relative to CMOS signal swing tends to complicate the return conversion from DPSS to CMOS signaling levels. FIG. 6 illustrates a prior art DPSS-to-CMOS converter circuit that receives complementary differential input DPSS signals, $IN_{DPSS}$ and $/IN_{DPSS}$, and that outputs a single-ended CMOS output signal, $OUT_C$. As $IN_{DPSS}$ goes high, transistor 201 is switched on, resulting in current I1 through transistor 205. Transistor 205 is coupled in a current mirror configuration with transistor 207, so that current I1 flows through transistor 207 and also through diode-configured transistor 209. Transistor 209 is coupled in a current mirror configuration with transistor 211, so that transistor 211 is switched on, thereby pulling output signal, $OUT_C$, to ground. While $IN_{DPSS}$ is high, $/IN_{DPSS}$ is low, so that transistor 203 is switched off, thereby switching off transistors 213 and 215. Thus, when $IN_{DPSS}$ is high, the output signal is pulled low by the switching on of transistors 201, 205, 207, 209 and then 211. By contrast, when $IN_{DPSS}$ is low and $/IN_{DPSS}$ is high, transistors 203, 213 and 215 are switched on to pull up the output signal, $OUT_C$, to the supply voltage. Thus, five transistors change state in sequence to pull the output signal low and only three transistors change state to pull the output signal high. Consequently, the output signal tends to transition more slowly in response to a low-to-high transition of the DPSS input signal than in response to a high to low transition of the DPSS input signal. That is, the conversion from DPSS to CMOS signaling levels tends to introduce duty cycle distortion to an otherwise distortion free DPSS clock signal. Duty cycle correction circuits may be added to correct the duty cycle distortion, but, at least in the architecture of FIG. 2, such circuits need to be added not only in the mix loop 123, but also within sampling clock generator 125 to avoid phase error due to propagation delay through the duty cycle correction circuit. Also, because of the process dependent nature of the DPSS to CMOS converter (and ensuing duty cycle distortion circuit), the propagation delays through the converter tend to be difficult to match between the converter 151 in the sample clock generator 125 and the converter 143 within the mix loop 123, thereby introducing a potential source of phase error in the sampling clock. Duty cycle correction circuits, if included, may introduce further phase error. Also, while only two DPSS-to-CMOS converters 143 and 151 are shown in the architecture of FIG. 2, it is often necessary to convert the DPSS-level phase vectors generated by the reference loop 121 to CMOS levels for exportation to the mixers 141 and 149, then convert back from CMOS to DPSS signaling levels at the front end of the mixers. Such conversions may introduce further duty cycle distortion and phase error in the sampling clock.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 illustrates a portion of a prior art mixer;
FIG. 4 illustrates a prior art signal converter circuit;
FIG. 5 illustrates the relative signal swings of CMOS and differential pair small-swing (DPSS) signals;
FIG. 6 illustrates another prior art signal converter circuit;
FIG. 8 illustrates a dual regulated small-swing (DRSS) reference loop according to an embodiment of the invention;
FIG. 9 illustrates a DRSS mixer according to an embodiment of the invention;
FIG. 10 illustrates a CMOS-to-DRSS signal converter according to an embodiment of the invention;
FIG. 11 depicts a DRSS-level signal superimposed over a CMOS-level signal;
FIG. 12 illustrates a DRSS-to-CMOS signal converter according to an embodiment of the invention;
FIG. 17 is a table that illustrates an exemplary relationship between an octant select signal, multiplexer control signals, mix vectors, and the ramp polarity of an interpolation word and complement interpolation word generated within the DRSS mixer of FIG. 16;

FIG. 18 illustrates an embodiment of a multiplexer that may be used within the DRSS mixer of FIG. 16;

FIG. 19 illustrates a DRSS mix amplifier according to an embodiment of the invention;

FIG. 20 illustrates the phase mixing of a leading mix vector and trailing mix vector in incremental phase steps;

FIG. 21 illustrates a transient phase error that may result from a race condition within the DRSS mix amplifier of FIG. 19;

DETAILED DESCRIPTION

Figure 1:
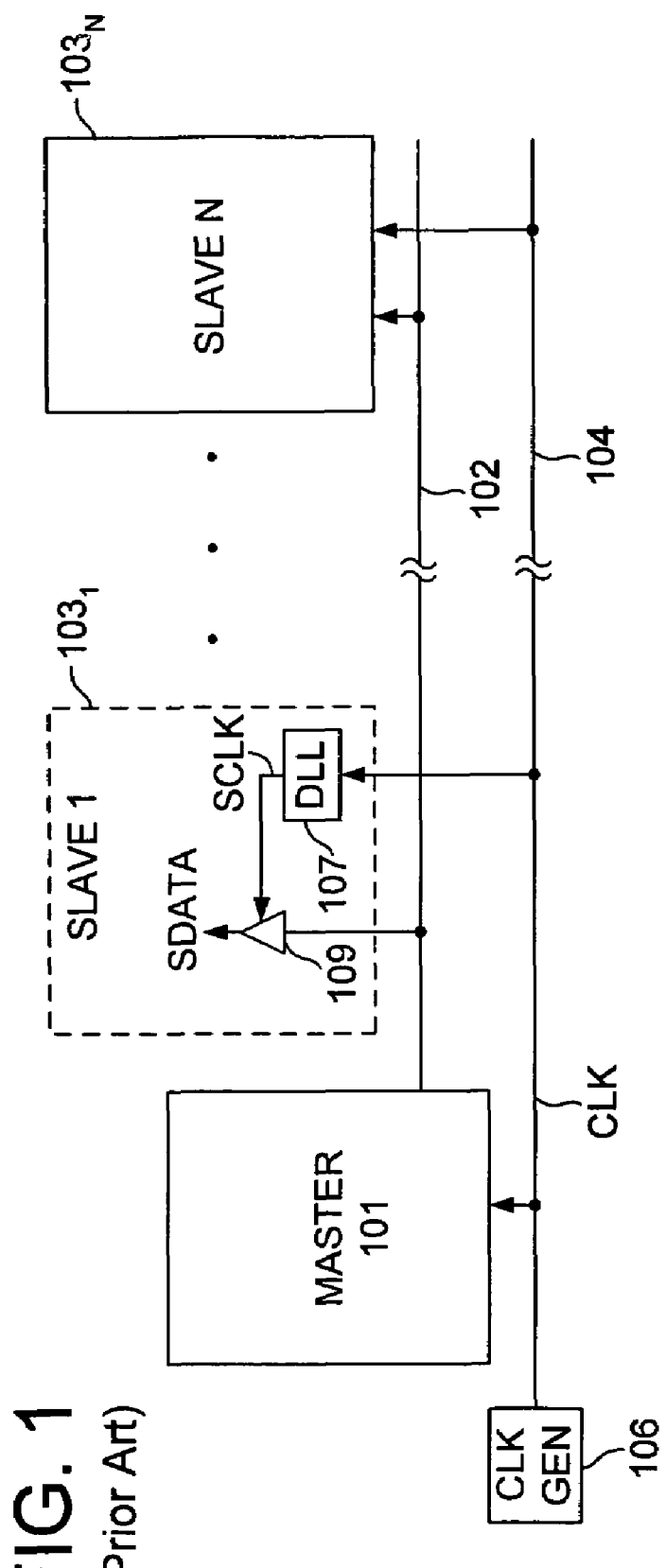
FIG. 1 illustrates a prior art signaling system.
Figure 2:
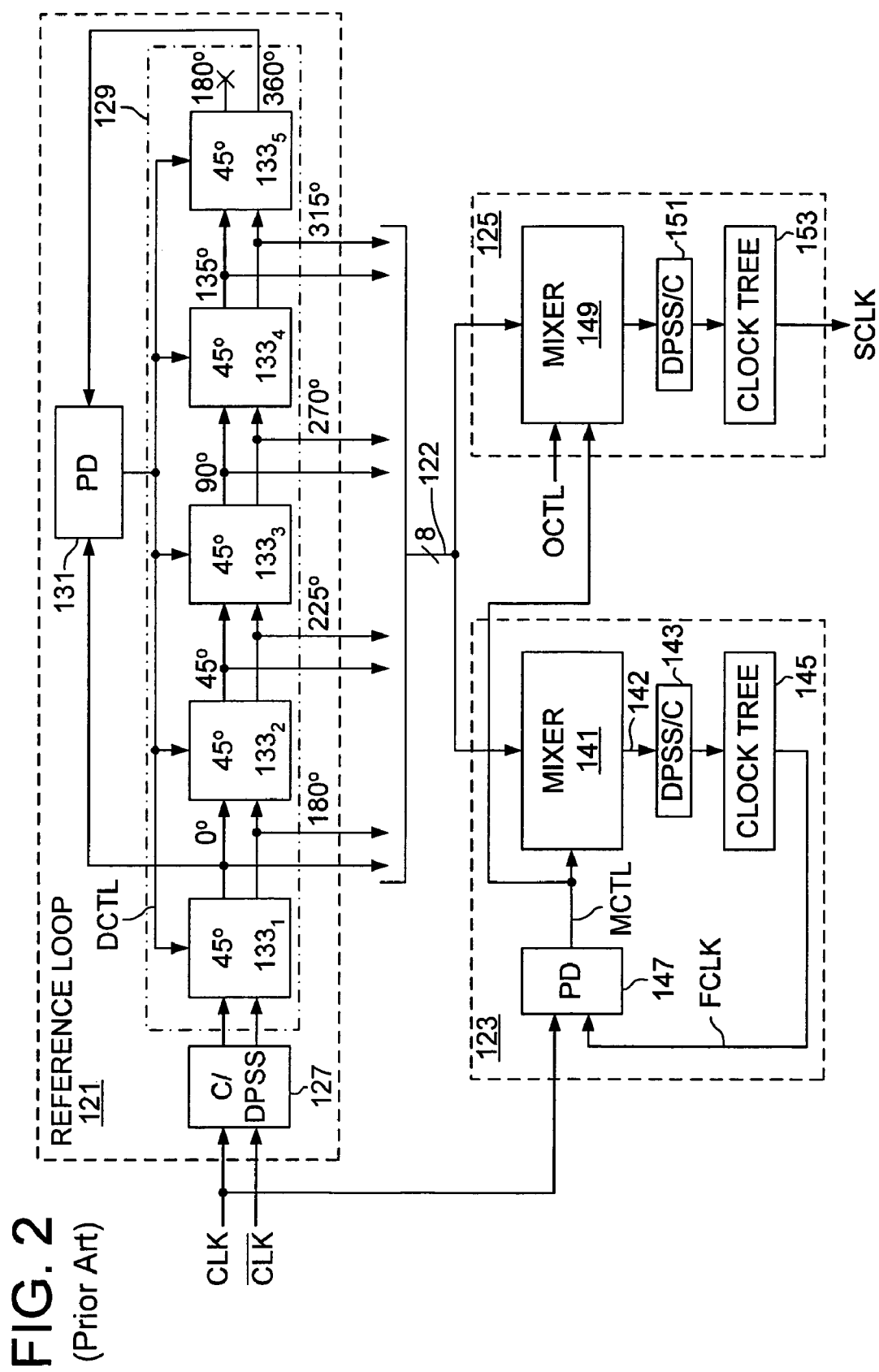
FIG. 2 illustrates a prior art delay locked loop circuit.

In the following description, for purposes of explanation, specific nomenclature is set forth to provide a thorough understanding of the present invention. However, it will be apparent to one skilled in the art that these specific details may not be required to practice the present invention. In some instances, the interconnection between circuit elements or circuit blocks may be shown as multi-conductor or single conductor signal lines. Each of the multi-conductor signal lines may alternatively be single signal conductor lines, and each of the single conductor signal lines may alternatively be multi-conductor signal lines. A signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signalname>}}$') is also used to indicate an active low signal. Active low signals may be changed to active high signals and vice-versa as is generally known in the art.

Dual Rail Regulated Delay Locked Loop

In embodiments of the present invention, both the upper and lower supply voltages to a chain of inverters are adjusted by a voltage regulation circuit to produce a desired input-to-output delay through the inverter chain. Signals generated by individual inverters within the inverter chain are output as reference phase vectors to a mixing circuit and have signaling levels referred to herein as dual regulated small swing (DRSS) signaling levels. Because both supply voltages to the inverter chain are adjusted toward or away from a midpoint between system supply voltages (e.g., toward or away from $V_{DD}/2$), the signal swing of each DRSS-level phase vector is substantially symmetric with respect to the signal swing of CMOS signals, thereby avoiding the duty cycle distortion problems that plague prior art converters upon re-conversion from small-swing to CMOS signaling levels.

In one embodiment, a mixing circuit within a DLL is formed by inverters that are sized to achieve a binary weighted delay in proportion to the delay introduced by an inverter within the inverter chain. By this arrangement, a pair of phase vectors may be mixed by inputting the phase vectors into respective sets of the binary weighted inverters and selectively enabling the binary weighted inverters to achieve a desired phase contribution from each of the phase vectors. Thus, unlike the prior art mixer described above, no DAC-generated bias voltage is needed, and the multi-clock cycle DAC settling time is avoided. As a result, substantially faster phase locking may be achieved and the time required to switch between arbitrary phase offsets may be reduced.

Overview of a DLL Circuit According to an Embodiment of the Invention

Figure 7:
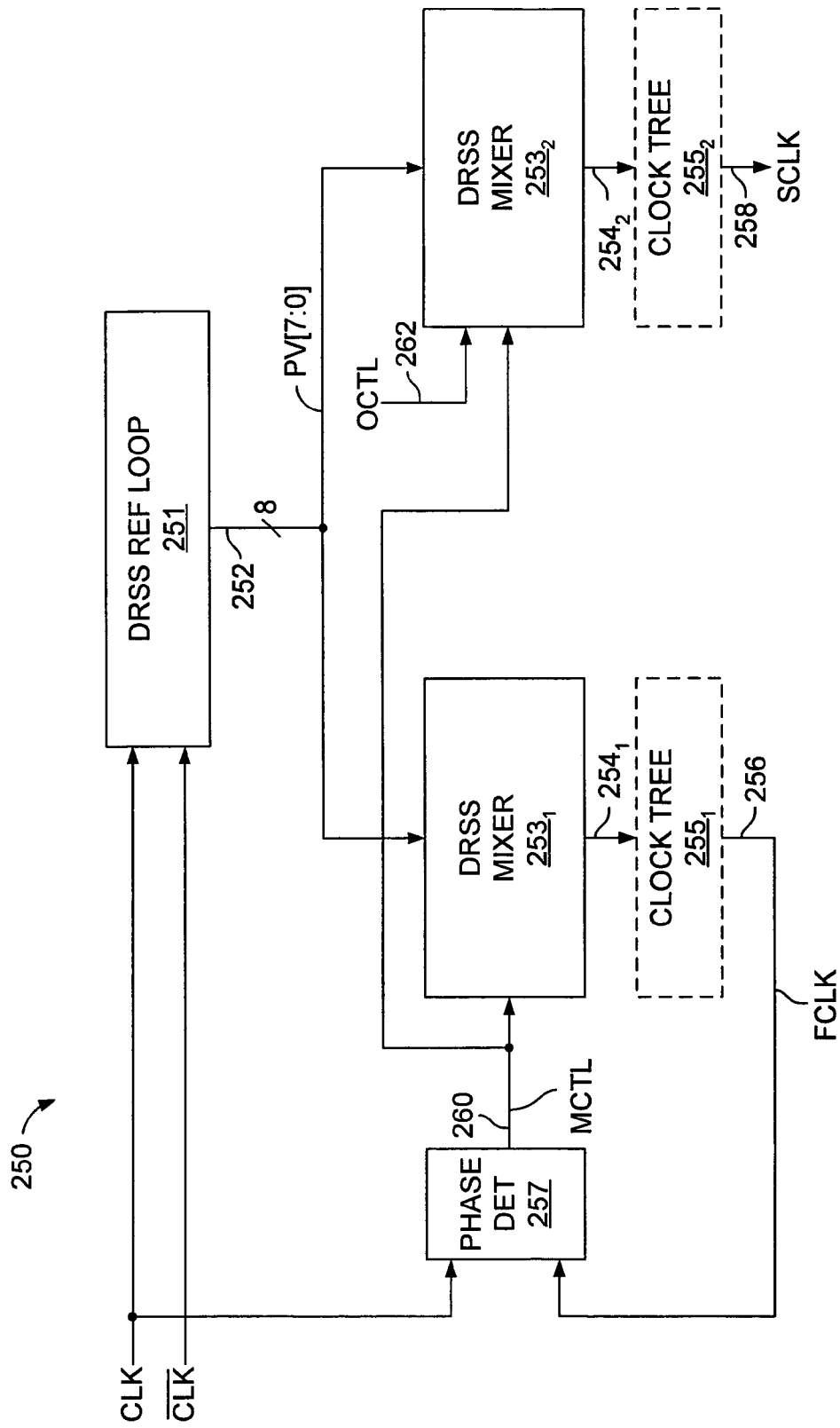
FIG. 7 illustrates a DLL circuit according to an embodiment of the invention.

FIG. 7 illustrates a DLL circuit 250 according to an embodiment of the invention. The DLL circuit 250 includes a DRSS reference loop 251, a pair of DRSS mixers 253$_1$ and 253$_2$, a pair of clock tree circuits 255$_1$ and 255$_2$, and a phase detector 257. The DRSS reference loop 251 receives a reference clock signal, CLK, and complement (i.e., inverted) reference clock signal, /CLK, and generates a set of phase vectors 252 (eight phase vectors in this example) that are incrementally offset in time (i.e., phase spaced) within a cycle period of the reference clock signal. The phase vectors 252 are supplied to the DRSS mixer circuits 253, each of which generates a respective mix clock signal, 254$_1$ and 254$_2$. The mix clock signal 254$_1$ is output to the clock tree circuit 255$_1$ which, in turn, generates a feedback clock signal 256 (FCLK). The mix clock signal 254$_2$ is output to the clock tree circuit 255$_2$ which outputs multiple instances of a sampling clock signal 258 (SCLK). In an alternative embodiment, where fan out of the sampling clock signal 258 is limited, the clock tree circuits 255$_1$ and 255$_2$ may be omitted. If present, the clock tree circuits 255$_1$ and 255$_2$ may be designed to have substantially the same electrical characteristics such that the mix clocks 254$_1$ and 254$_2$ experience the same propagation delays to generate clock signals 256 and 258, respectively.

The phase detector 257 receives the feedback and reference clock signals (FCLK and CLK) and generates a mix control signal 260 (MCTL) that indicates whether the reference clock signal leads or lags the feedback clock signal. Mix logic within the DRSS mixer 253$_1$ responds to the mix control signal 260 by advancing or retarding the phase of the mix clock signal 254$_1$ and, therefore, advancing or retarding the phase of the feedback clock signal 256. In one embodiment the phase detector 257 is a zero phase detector (ZPD) in which the feedback clock signal 256 is used to sample the reference clock signal and thereby generate the mix control signal 260 according to whether the reference clock signal has changed state before or after the sampling instant (i.e., before or after an edge of feedback clock signal 256). Alternatively, the reference clock signal may be used to sample the feedback clock signal 256. Also, other types of phase detectors may be used in alternative embodiments.

The DRSS mixer $253_2$ receives both the mix control signal 260 and an offset control value 262 (OCTL). The offset control value 262 is used to provide an adjustable offset between the sampling clock signal 258 and the reference clock signal. Mix logic within the DRSS mixer $253_2$ responds to the state of the mix control signal 260 by advancing or retarding the phase of the mix clock signal $254_2$ and, therefore, the sampling clock signal 258. Thus, if the offset control value specifies a zero phase offset, the sampling clock signal 258 and feedback clock signal 256 will remain substantially phase aligned with one another and with the reference clock signal.

In one embodiment, the offset control value 262 is maintained in a configuration circuit within the integrated circuit device that includes the DLL circuit 250. The configuration circuit may be a volatile or non-volatile memory, or a fusible or otherwise one-time programmable circuit. Also, instead of on-chip configuration, the offset control value 262 may be maintained or generated by a device that is external to integrated circuit that contains the DLL circuit 250. Whether maintained on or off chip, the offset control value 262 may be initialized at system startup (e.g., as part of a calibration procedure that determines a desired offset between the sampling clock signal and reference clock signal) and/or updated in periodic calibration operations or in response to predetermined events (e.g., detection of threshold error rate or threshold phase difference between center of data eye and edge of sampling clock signal 258). Also, because the DRSS mixer $253_2$ is able to adjust the phase of the sampling clock signal 258 relatively quickly in response to changes in the mix control signal 260 and/or offset control value 262, the offset control value 262 may be adjusted between successive reception and/or transmission operations to achieve a phase-jumping mode of operation. Phase jumping is discussed below in greater detail.

Dual Regulated Small Swing Signal Conversion

FIG. 8 illustrates a DRSS reference loop 280 according to an embodiment of the invention. The DRSS reference loop 280 may be used, for example, to implement DRSS reference loop 251 of FIG. 7 and includes a CMOS-to-DRSS converter 281 (CDC), a DRSS phase vector generator 283 and a DRSS-to-CMOS converter 285 (DCC). The CMOS-to-DRSS converter 281 receives the complementary CMOS-level reference clock signals, CLK and /CLK, and converts the CMOS reference clock signals to complementary clock signals 282 having DRSS signal levels. The DRSS phase vector generator 283 receives the complementary DRSS-level reference clock signals 282 and generates a set of DRSS-level phase vectors 284. In the embodiment of FIG. 10 there are eight phase vectors 284 offset from an arbitrary reference phase by n*45 degrees, where n=0, 1, 2, . . . , 7. That is, the phase vectors have phase angles of 0, 45, 90, 135, 180, 225, 270 and 315 degrees. In alternative embodiments, there may be more or fewer phase vectors separated by smaller or larger phase angles, respectively. Also, in the embodiment of FIG. 10, the phase vectors are output to the DRSS-to-CMOS converter 285 for conversion from DRSS to CMOS signaling levels. The CMOS-level phase vectors 286 are then exported to the mixer circuits 253 of FIG. 7. In an alternative embodiment, the DRSS-level phase vectors themselves are output to the mixer circuits 253 and the DRSS-to-CMOS converter 285 is omitted from the DRSS reference loop 280.

FIG. 9 illustrates a DRSS mixer 300 according to an embodiment of the invention. The DRSS mixer 300 may be used, for example, to implement either of mixers 253 of FIG. 7. In the case of DRSS mixer $253_1$, the offset control signal 262 may be omitted as indicated by the dashed input arrow. The DRSS mixer 300 includes mix logic 301, phase vector selector 303, CMOS-to-DRSS converter 305, DRSS mix amplifiers 307 and DRSS-to-CMOS converter 309. The mix logic 301 responds to the mix control signal 260 (i.e., from phase detector 257 of FIG. 7) and, optionally, the offset control signal 262 to generate a select signal 302 (SEL) and interpolation word 304 (IW). The select signal 302 is output to the phase vector selector 303 to control the selection of a pair of mix vectors, MV0 and MV1, and a pair of complement mix vectors, /MV0 and /MV1. The selected mix vectors (and complement mix vectors) are converted from CMOS to DRSS signaling levels by converter 305, then input to DRSS mix amplifiers 307. In an embodiment in which DRSS-level phase vectors (i.e., vectors 284 of FIG. 8) are output directly from the DRSS reference loop 280 of FIG. 8, the CMOS-to-DRSS converter 305 may be omitted. The DRSS mix amplifiers 307 mix the selected mix vectors and complement mix vectors in accordance with the interpolation word 304 to generate a DRSS-level mix clock signal, $MCLK_{DRSS}$, and complement mix clock signal, $/MCLK_{DRSS}$. The mix clock signal and complement mix clock signal are converted to complementary CMOS-level clock signals, $MCLK_C$ and $/MCLK_C$ by the DRSS-to-CMOS converter 309, then output from the DRSS mixer 300.

FIG. 10 illustrates a CMOS-to-DRSS converter 320 according to an embodiment of the invention. The converter 320 may be used, for example, within the DRSS reference loop 280 of FIG. 8 (i.e., to implement converter 281) and within the DRSS mixer 300 of FIG. 9 (i.e., using two converters 320 to implement converter 305). The converter 320 includes a PMOS (positively-doped, metal oxide semiconductor) transistor 321 and an NMOS (negatively-doped, metal oxide semiconductor) transistor 323 coupled in an inverting configuration. That is, the gate terminals of the transistors 321 and 323 are each coupled to an input signal line 322 to receive a CMOS-level input signal, $IN_C$, and the drain terminals of the transistors are each coupled to an output signal line 324 to drive a DRSS-level output signal $OUT_{DRSS}$. The source terminal of transistor 321 is coupled to a first regulated supply voltage, REG+, and the source terminal of transistor 323 is coupled to a second, lower regulated supply voltage, REG−. Together, the regulated voltages, REG+ and REG−, constitute dual regulated supply voltages which are generated by a dual rail regulation circuit to achieve a specific delay through inverter circuits within the DRSS reference loop. The operation of the dual rail regulation circuit is discussed below. When the input signal $IN_C$ is low, transistor 323 is switched off and transistor 321 is switched on to couple the more positive regulated voltage, REG+, to the output signal line 324. When the input signal is high, transistor 321 is switched off and transistor 323 is switched on to couple the more negative regulated voltage, REG−, to the output signal line 324. Thus, the CMOS-to-DRSS converter 320 is a dual-rail regulated inverter (i.e., both supply voltages are regulated) which generates an inverted output signal (relative to the input signal) that swings between the regulated supply voltages, REG+ and REG−.

FIG. 11 depicts a DRSS-level signal 328 superimposed over a CMOS-level signal 328 to illustrate the symmetry between the swings of the two signals. The CMOS signal 328 swings between a system supply voltage and a ground reference voltage (referred to herein as $V_{DD}$ and GND, respectively), while the DRSS signal swings between regulated voltages (REG+ and REG−) that are offset from the system supply and ground voltages, respectively, by a substantially equal voltage offsets. That is, REG− is more positive than GND by a given voltage offset, and REG+ is more negative than $V_{DD}$ by that the same voltage offset. Consequently, the swing of the DRSS signal 326 is centered about the CMOS common mode voltage, (VDD−GND)/2 (referred to herein as CMOS common mode, $V_{DD}/2$), like the CMOS signal 328 itself. This symmetric swing about the CMOS common mode distinguishes the DRSS signal level from the DPSS signal swing which is asymmetric with respect to the CMOS common mode. As discussed below in reference to FIG. 12, the symmetry between the DRSS and CMOS signal swings enables conversion from DRSS to CMOS signaling level without the duty cycle distortion that plagues the prior art DPSS-to-CMOS conversion circuit described above.

FIG. 12 illustrates a DRSS-to-CMOS signal converter 335 according to an embodiment of the invention. The converter 335 may be used, for example, within the DRSS reference loop 280 of FIG. 8 (i.e., to implement converter 285) and within the DRSS mixer 300 of FIG. 9 (i.e., to implement converter 309). The converter 335 includes a first pair of transistors 337 and 339 and a second pair of transistors 341 and 343, each transistor pair being coupled in an inverting configuration between current sourcing transistor 345 and current sinking transistor 347. Each pair of inverter-coupled transistors includes a PMOS transistor (337, 341) having a source coupled to a source terminal of current sourcing transistor 345, and a NMOS transistor (339, 343) having a drain coupled to the drain of the PMOS transistor (337, 341, respectively) and a source coupled to the drain of current sinking transistor 347. The gate terminals of transistors 337 and 339 are each coupled to signal line 336 to receive a DRSS input signal, $IN_{DRSS}$, and the gate terminals of transistors 341 and 343 are each coupled to signal line 338 to receive a complement DRSS input signal, $/IN_{DRSS}$. Each transistor pair 337/339 and 341/343 operates in the same manner, but in a complementary fashion. Thus, when the input signal 336 transitions from low to high, transistor 337 switches off and transistor 339 switches on, thereby pulling output line 340 down to a potential close to ground (i.e., ground plus the voltage drop across transistor 347). At the same time, the complement input signal 338 transitions from high to low so that transistor 343 switches off and transistor 341 switches on, thereby pulling output line 342 up to a potential close to $V_{DD}$ (i.e., $V_{DD}$ less the voltage drop across transistor 345). Due to the different operating characteristics of the PMOS and NMOS transistors within a given transistor pair (337/339 and 341/343), the pull-up and pull-down operation of the transistor pair tends to be asymmetric. Because the two transistor pairs are transitioned in response to complementary input signals, however, the loading is balanced for both rising and falling edges of the input signal, so that the rise and fall times of the output clock signal are substantially symmetrical. That is, little or no duty cycle distortion occurs in the transition from DRSS to CMOS signaling levels. Consequently, in contrast to the prior art DLL circuit described in reference to FIGS. 1–6, no duty cycle correction circuits are necessary to correct for conversion-induced duty cycle distortion, simplifying system design and removing a potential source of phase error in the final sampling clock signal.

Still referring to FIG. 12, because the input signals, $IN_{DRSS}$ and $/IN_{DRSS}$, are DRSS-level signals, the transistors within either transistor pair 337/339 and 341/343 may not be switched all the way off or all the way on, and therefore tend to draw static current. The current sourcing and current sinking transistors 345 and 347 are biased by respective bias voltages (which may be different) to limit the static current drawn by the converter circuit 335. Because the current sourcing and current sinking transistors introduce voltage offsets between full scale CMOS levels (e.g., $V_{DD}$ and GND), additional inverter stages may be coupled to the output lines 340 and 342 to increase the amplitude of the $OUT_C$ and $/OUT_C$ signals.

Dual Regulated Small Swing Reference Loop

Figure 13:
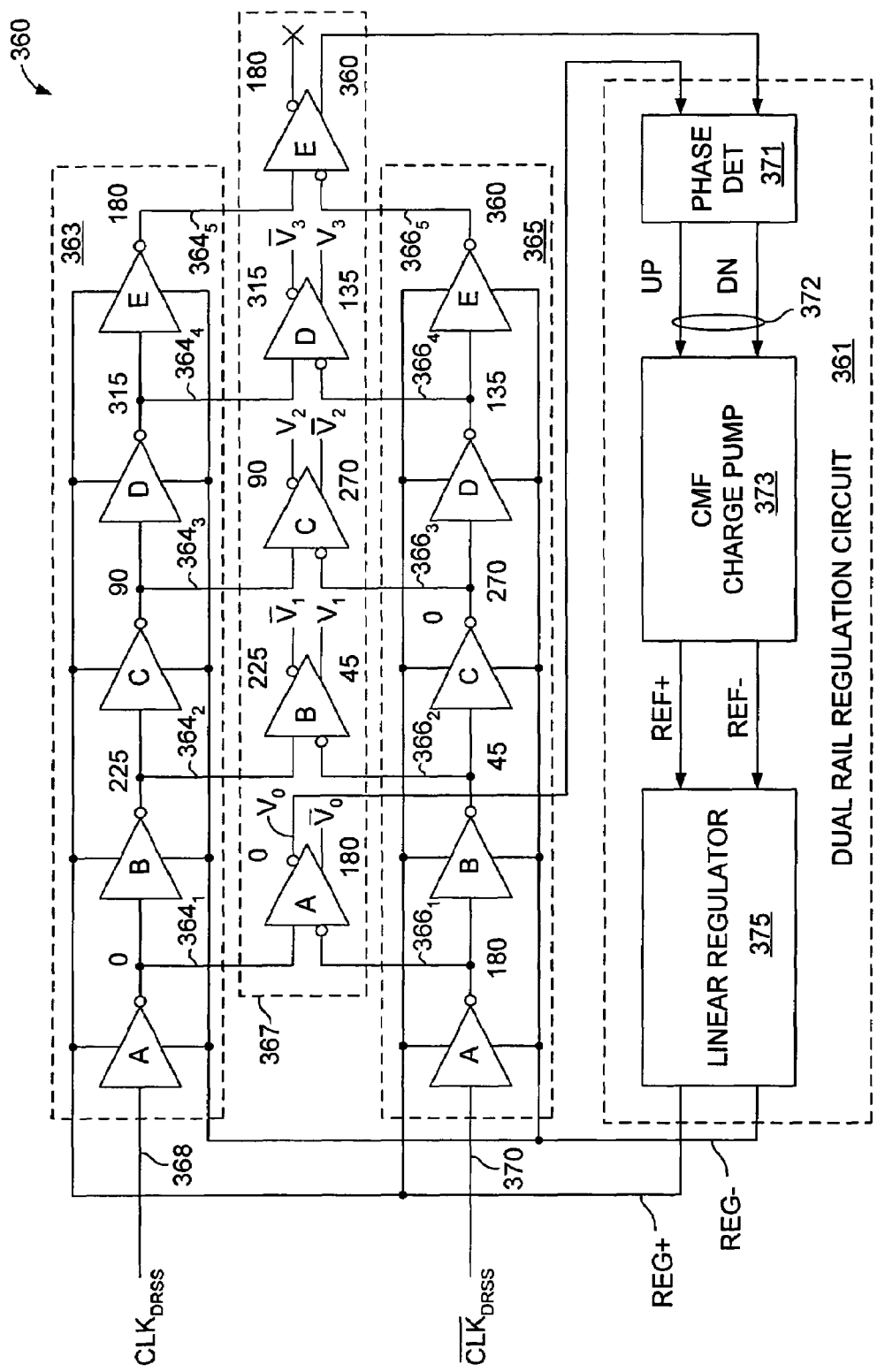
FIG. 13 illustrates a DRSS reference loop according to an embodiment of the invention.

FIG. 13 illustrates a DRSS reference loop 360 according to an embodiment of the invention. The DRSS reference loop 360 may be used, for example, to implement DRSS reference loop 250 of FIG. 7. The reference loop 360 includes a dual rail regulation circuit 361, a pair of delay lines 363 and 365, and a set of DRSS-to-CMOS converters 367. Each of the delay lines 363 and 365 is formed by a chain of delay elements (i.e., elements A–E) that receives a DRSS-level reference clock (i.e., $CLK_{DRSS}$ or $/CLK_{DRSS}$) at an input node (368 and 370, respectively) and that outputs a set of incrementally delayed phase vectors. In the embodiment of FIG. 13, each of the delay elements within delay lines 363 and 365 is an inverter that introduces an input-to-output delay (i.e., phase delay) that varies according to regulated supply voltages, REG+ and REG−, generated by the dual rail regulation circuit 361. Each of the delay lines 363 and 365 includes five such inverters, A, B, C, D and E, coupled in a daisy-chained manner. That is, the output of inverter A is coupled to the input of inverter B, the output of inverter B is coupled to the input of inverter C, the output of inverter C is coupled to the input of inverter D, and the output of inverter D is coupled to the input of inverter E. The input of the first inverter in the chain (i.e., inverter A) forms the input node of the delay line and the output of each inverter in the chain forms a respective output node of the delay line. In alternative embodiments, non-inverting amplifiers (e.g., formed by back-to-back inverters) may be used to implement each delay element. Also, there may be more or fewer delay elements per delay line than shown in FIG. 13.

The dual rail regulation circuit 361 adjusts the regulated voltages, REG+ and REG−, to achieve a desired delay through each of the delay lines. More specifically, the dual rail regulation circuit 361 adjusts the upper and lower regulated voltages, REG+ and REG−, in response to a phase difference between a selected pair of clock signals output by the delay lines 363 and 365 (and, optionally converted to CMOS signaling levels) such that the propagation delay through a subset of the delay elements within each delay line 363 and 365 is equal to half the period (i.e., 180 degrees) of the reference clock signal. In the example of FIG. 18, the subset of delay elements for which the propagation delay is controlled includes inverters B–E within each delay line 363, 365 such that, designating the output of inverter A of delay line 363 to be a zero degree phase vector, the output of inverter E of delay line 363 is a 180 degree phase vector and, similarly the output of inverter A of delay line 365 is a 180 degree phase vector and the output of inverter E of delay line 365 is a 360 degree phase vector. Because four delay elements are used to achieve the 180 degree delay within each delay line, the delay introduced by any one of the delay elements is substantially equal to ⅛$^{th}$ the period (i.e., 45 degrees) of the reference clock signal, a time interval referred to herein as a 45 degree interval. That is, from the time an input signal to a given delay element crosses the midpoint voltage between the REG+ and REG− voltages to the time that delay element output signal crosses the midpoint voltage is substantially equal to a 45 degree interval. Accordingly, the outputs of each of the inverter elements A–E within a given delay line are offset from one another by 45 degree intervals, plus an inversion angle (i.e., 180 degrees) at the outputs of inverters B and D. By this arrangement, the outputs of each of the delay elements A–D of delay line 363 constitute 0, 225, 90 and 315 degree phase vectors ($364_1$–$364_4$), while the outputs of delay elements A–D within delay line 365 constitute 180, 45, 270 and 135 degree phase vectors ($366_1$–$366_4$). Thus, when the regulated voltages, REG+ and REG−, are adjusted to produce a half cycle delay from the output of inverter A to the output of inverter E within each delay line 363 and 365, the eight DRSS-level clock signals output by inverters A–D within each delay line (i.e., signals $364_1$–$364_4$ and $366_1$–$366_4$) constitute eight phase vectors spaced at incremental 45 degree phase offsets throughout a cycle of the reference clock signal. The set of converters 367 includes DRSS-CMOS converters A–E to convert signals $364_1$–$364_5$ and $366_1$–$366_5$ from DRSS to CMOS signaling levels. Note that while phase delay is introduced by the converter circuits (including, in an embodiment that employs the converter 335 of FIG. 12, an inversion angle of 180 degrees), the selection of the zero degree reference point is arbitrary such that the CMOS-level phase vectors output by converter A may be viewed as 0 and 180 degree phase vectors, the outputs of converter B as 45 and 225 degree phase vectors and so forth to converter E, which outputs 180 and 360 degree phase vectors. The phase vectors output by converters A–D are designated in FIG. 13 (and referred to hereinafter) as vectors $V_0$ (0 degrees), $V_1$ (45 degrees), $V_2$ (90 degrees) $V_3$ (135 degrees), /$V_0$ (180 degrees), /$V_1$ (225 degrees), /$V_2$ (270 degrees) and /$V_3$ (315 degrees).

In the embodiment of FIG. 13, the 180 degree phase vector output by converter E is unused and the 360 degree phase vector output by converter E is provided to the dual rail regulation circuit for phase comparison with the 0 degree phase vector, $V_0$. Note that in alternative embodiments, more or fewer delay elements may be interposed between the 0 and 180 degree generating delay elements within delay line 363 and between the 180 and 360 degree generating delay elements within delay line 365 such that the reference clock cycle is subdivided by more or fewer phase vectors.

The dual regulation circuit 361 includes a phase detector 371, common-mode-feedback charge pump 373 and linear regulator 375. The phase detector 371 is coupled to receive the nominally 360 degree phase vector from a converter E (a most delayed phase vector) and to receive the 0 degree phase vector, $V_0$, from converter A (a least delayed phase vector). The phase detector 371 compares the 0 and 360 degree phase vectors and generates a voltage control signal 372 according to which of the vectors leads the other. More specifically, the phase detector 371 asserts (e.g., to a logic high state) an up signal (UP) to reduce the delay through the delay lines 373 and 375 if the 360 degree phase vector lags the zero degree phase vector, and asserts a down signal (DN) to increase the delay if the 360 degree phase vector leads the zero degree phase vector. In one embodiment the phase detector 371 is a zero phase detector (ZPD) in which the 0 degree phase vector is used to sample the 360 degree phase vector and thereby generate the voltage control signal 372 according to whether the 360 degree phase vector has changed state before or after the sampling instant (i.e., before or after an edge of the 0 degree phase vector). Alternatively, the 360 degree phase vector may be used to sample the 0 degree phase vector. Also, other types of phase detectors may be used in alternative embodiments.

The up and down signal components of the voltage control signal 372 are received by the common-mode-feedback charge pump 373 and used to adjust the levels of reference voltages, REF+ and REF−. The reference voltages, REF+ and REF−, are output to the linear regulator 375 where they are used to generate the regulated voltages, REG+ and REG−. Overall, the negative feedback operation of the reference loop 360 drives the regulated voltages, REG+ and REG−, to the levels necessary to achieve phase alignment between the 360 degree and 0 degree phase vectors input to the phase detector 371. As discussed below, the common-mode-feedback charge pump 373 includes a negative-feedback bias control circuit that maintains the common mode between the REF+ and REF− voltages, and therefore the common mode between the REG+ and REG− voltages, substantially at the common mode of the system supply voltages, $V_{DD}$ and GND. That is, the regulated voltages, REG+ and REG−, generated by the dual rail regulation circuit 361 are maintained substantially centered about the CMOS common mode. In an alternative embodiment, the set of DRSS to CMOS converters 367 may be omitted, and the 0 degree phase vector output by inverter A of delay line 363 and the 360 degree phase vector output by inverter E of delay line 365 may be input directly to the phase detector 371.

Figure 14:
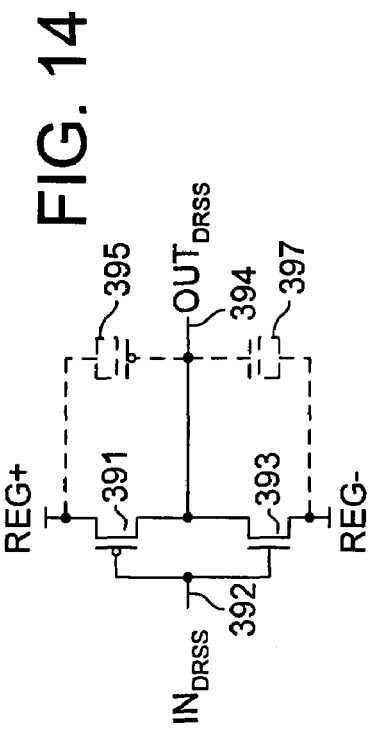
FIG. 14 illustrates a DRSS delay element according to an embodiment of the invention.

FIG. 14 illustrates a DRSS delay element 390 according to an embodiment of the invention. The DRSS delay element 390 that may be used, for example, to implement inverters A–E within either of the delay lines 363, 365 of FIG. 13. As shown, the DRSS delay element 390 includes a PMOS transistor 391 and an NMOS transistor 393 coupled in an inverting configuration. That is, a source terminal of transistor 393 is coupled to the regulated voltage, REG−, and a source terminal of transistor 391 is coupled to the regulated voltage, REG+. The gate terminals of the transistors 391 and 393 are each coupled to an input line 392 to receive a DRSS-level input signal, and the drain terminals of the transistors 391 and 393 are each coupled to an output line 394 to output a delayed DRSS-level output signal.

Figure 15:
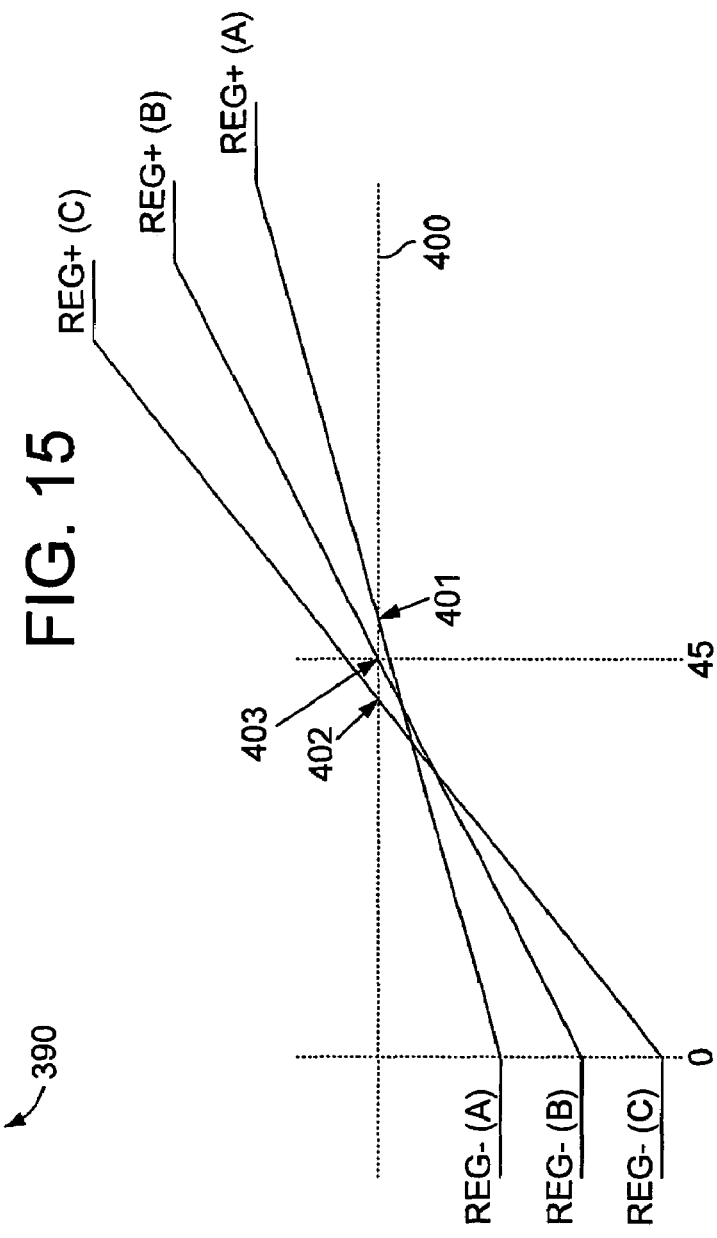
FIG. 15 illustrates output signals generated by the delay element of FIG. 14 for three different pairs of regulated voltages.

Still referring to FIG. 14, when a DRSS-level input signal transitions from low to high (i.e., from REG− to REG+), transistor 391 is switched off and transistor 393 is switched on such that the output line is pulled down from the REG+ to the REG− voltage level. Conversely, when the input signal transitions from high to low, transistor 391 is switched on and transistor 393 is switched off such that the output line is pulled up from the REG− to the REG+ voltage level. The rate at which the transistors 391 and 393 charge and discharge the output line 394 is determined, in part, by the regulated voltages REG+ and REG−. Referring to FIG. 15, for example, the slew rates of the output signal generated by delay element 390 are shown for three different pairs of regulated voltages, A, B and C. In the case of regulated voltage pair A, the difference between REG+ and REG− (i.e., the rail-to-rail potential) is relatively low, resulting in a relatively slow slew rate between low and high output levels (note that only the low to high transition is shown in FIG. 15, but that the high to low slew rate is likewise slowed by the low rail-to-rail potential). Thus, the transition from low to high when the regulated voltages are at level A occurs slowly enough that the crossing of the regulated common mode voltage 400 (i.e., midpoint between REG+ and REG− voltages) occurs late relative to the 45 degree time (as shown by arrow 401). Accordingly, the output of the next inverter in an inverter chain will begin transitioning late relative is to the 45 delay point resulting in an accumulation of late transitions. Consequently, the clock delay introduced by a chain of four delay elements 390 powered by regulated voltage pair A will be greater than 180 degrees. In the case of regulated voltage pair C, the slew rate of the output signal generated by delay element 390 is fast enough that the regulated common mode voltage crossing occurs prior to the 45 degree time, as indicated by arrow 402. Accordingly, the clock delay introduced by a chain of four delay elements 390 powered by regulated voltage pair C will be less than 180 degrees. At regulated voltage pair B, the drive strength of the delay element 390 is such that the output signal crosses the regulated common mode voltage 400 coincidentally with the 45 degree time, as indicated by arrow 403. Consequently, at regulated voltage pair B, each delay element 390 introduces a 45 degree delay between input and output crossings of the regulated common mode voltage and a chain of four delay elements 390 powered by regulated voltage pair B will produce a clock delay substantially equal to 180 degrees.

Referring again to FIG. 14, the output drive strength of the delay element 390 is dependent, in part, upon the gain of the transistors 391 and 393, which may be controlled, for example, by process (e.g., doping) and/or transistor sizing (e.g., width/length ratio). In one embodiment, the gain of transistors 391 and 393 is selected such that the slowest process satisfies the maximum anticipated reference clock frequency. Other parameters may be used to specify and/or set the gains in alternative embodiments. Also, capacitive elements 395 and 397 (e.g., drain-to-source coupled PMOS transistor and drain-to-source coupled NMOS transistor) may be coupled in parallel with transistors 391 and 393 in applications where a sufficiently slow slew rate cannot conveniently be achieved by transistor sizing, process selection, etc.

Note that, in a delay line formed by a chain of delay elements 390, the desired delay between input and output transitions of any single delay element in the chain depends, in part, on the number of delay elements interposed between the 0 and 180 degree outputs. If four such delay elements are used (as in the delay lines 363 and 365 of FIG. 13), an input-to-output delay (i.e., of each delay element 390) equal to the 45 degree interval is needed to create phase alignment between the 0 degree phase vector and the 360 degree phase vector. If, for example, eight such delay elements are used instead of four, a delay of 180/8=22.5 degrees is needed to create the same phase alignment. Although 45 degree intervals are described as the desired separation between phase vectors in the remainder of the description, different degrees of phase vector separation may be used in alternative embodiments.

Referring again to FIG. 15, it should be noted that the slew rate changes exponentially in response to a change in the rail-to-rail potential. That is, as the difference between the upper and lower regulated voltages, REG+ and REG−, is increased and decreased, the slew rate of a delay element output signal increases and decreases rapidly enough that the regulated common mode voltage crossing time is advanced and delayed. Consequently, an equilibrium point may be reached at which the difference between the upper and lower regulated voltages will produce a desired midpoint crossing time. In the case of FIG. 15, in which the desired crossing time corresponds to 45 degree interval, the equilibrium point at voltage pair B.

Dual Regulated Small Swing Mixer

Figure 16:
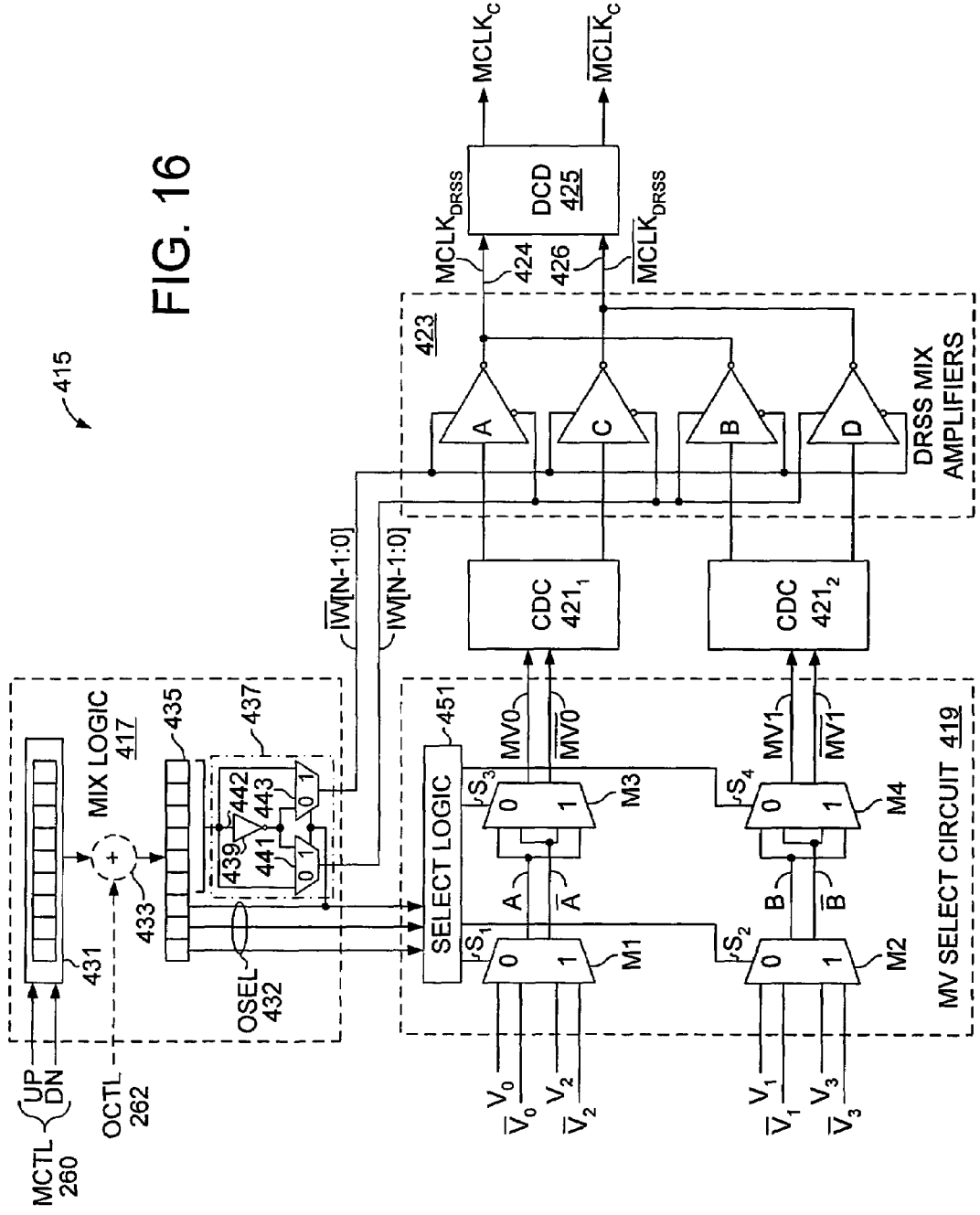
FIG. 16 illustrates a DRSS mixer according to an embodiment of the invention.

FIG. 16 illustrates a DRSS mixer 415 according to an embodiment of the invention. The DRSS mixer 415 may be used, for example, to implement either the DRSS mixer $253_1$ or the DRSS mixer $253_2$ of FIG. 7. The DRSS mixer 415 includes mix logic 417, mix vector select circuit 419, CMOS-to-DRSS converters $421_1$ and $421_2$, DRSS mix amplifiers 423, and DRSS-to-CMOS converter 425. The mix logic 417 includes a counter 431 that is incremented up or down in response to a mix control signal 260, MCTL; an optional adder circuit 433 that is used to add an offset control value 262 (OCTL) to the count value maintained within the counter 431, and a ramp polarity selector 437. In the case of the DRSS mixer $253_1$ of FIG. 7, the adder circuit 433 is omitted and no offset value is added to the count value maintain within the counter 431. By contrast, in the DRSS mixer $253_2$ of FIG. 7, the adder 433 is included to generate an offset count value by adding the offset control value 262 to the count value maintained within the counter 431. The offset count value may be stored within a register 435 (or other storage circuit) or directly output to the mix vector select circuit 419 and ramp polarity selector 437. In the embodiment of FIG. 16, the count value maintained within the counter 431 (and the offset count value, if used) is a 9-bit value in which the most significant three bits constitute an octant select signal 432 (OSEL) and the least significant six bits forms an interpolation value 442. More or fewer bits may be used to form the octant select signal 432 and/or interpolation value 442 in alternative embodiments.

The mix vector select circuit 419 receives the octant select signal 432 and includes select logic 451 and multiplexers M1, M2, M3 and M4 to select a pair of octant-bounding phase vectors and their complements from the set of eight phase vectors output from the reference loop (i.e., V0–V3 and /V0–/V3). That is, the mix vector select circuit 419 selects, according to the octant select signal 432, a pair of phase vectors (and their complements) that are offset from one another by a 45 degree interval and that therefore bound an octant within the 360 degree phase plot of a reference clock signal. The selected pairs of phase vectors are referred to herein as mix vectors, MV0 and MV1, and complement mix vectors, /MV0 and /MV1, as they are mixed by the DRSS mix amplifiers 423 to produce mix clock signals, MCLK and /MCLK.

Note that, in a system in which more or fewer than eight phase vectors are input to the mix vector select circuit 419, the number of bits maintained within counter 431 (and offset count register 435, if used) for selection of a vector pair may be greater or less than three. In general, if N phase vectors are input to the mix vector select circuit 419, $\log_2 N$ bits are needed to select a pair of mix vectors and complement mix vectors.

Still referring to FIG. 16, the select logic 451 responds to the octant select signal 432 by outputting control signals S1, S2 S3 and S4 to multiplexers M1, M2, M3 and M4, respectively. Multiplexer M1 receives phase vectors $V_0$ and $V_2$ (and complement vectors /$V_0$ and /$V_2$), while multiplexer M2 receives phase vectors $V_1$ and $V_3$ (and complement vectors /$V_1$ and /$V_3$). Depending upon the state of control signal S1, multiplexer M1 will output either phase vectors V0 and /V0 or phase vectors V2 and /V2 as vectors A and /A. Similarly, multiplexer M2 will output, according to control signal S2, either phase vectors V1 and /V1 or phase vectors V3 and /V3 as vectors B and /B. Multiplexer M3 receives vectors A and /A from multiplexer M1 and outputs, according to control signal S3, either vector A or vector /A as mix vector MV0 and, conversely, vector /A or A as complement mix vector /MV0. Similarly, Multiplexer M4 receives vectors B and /B from multiplexer M2 and outputs, according to control signal S4, either vector B or vector /B as mix vector MV1 and, conversely, vector /B or B as complement mix vector /MV1. By this arrangement, any pair of octant-bounding phase vectors may be selected as mix vectors MV0 and MV1, and their complements selected as mix vectors /MV0 and /MV1.

The CMOS-to-DRSS converters $421_1$ and $421_2$ are provided to convert the signal levels of the selected mix vectors (i.e., MV0, MV1, /MV0 and /MV1) from CMOS to DRSS signal levels before the mix vectors are input to the DRSS mix amplifiers 423. As discussed above, in an embodiment in which the DRSS reference loop outputs DRSS-level phase vectors, the converters $421_1$ and $421_2$ may be omitted.

Referring again to the mix logic 417, the ramp polarity selector 437 includes an inverter 439 and a pair of multiplexers 441 and 443 to generate an N-bit interpolation word, IW, and N-bit complement interpolation word, /IW, in response to the interpolation value 442. The purpose of the ramp polarity selector 437 is to ramp the interpolation word (i.e., in response to increases in the count value) in an increasing direction for certain selected pairs of mix vectors and to ramp the interpolation word in a decreasing direction for other selected pairs of mix vectors. This operation is described in further detail below. Note that a stage of flip-flops or other synchronizing circuits may be provided to synchronize the outputs of the mix logic so that the interpolation word, IW, complement interpolation word, /IW, and octant select signal 432 all change state synchronously in response to changes in the count value (i.e., maintained within counter 431) or offset count value.

The DRSS mix amplifier block 423 includes four mix amplifiers A, B, C and D, that each receive a respective one of the mix vectors, MV0, MV1, /MV0 and /MV1, and that each receive the interpolation word, IW, and complement interpolation word, /IW. More specifically, mix amplifiers A and B receive the uncomplemented mix vectors, MV0 and MV1, respectively, while mix amplifiers C and D receive complement mix vectors, /MV0 and /MV1. Also, mix amplifiers A and C receive the interpolation word and complement interpolation word at inverting and noninverting control inputs, respectively, while mix amplifiers B and D receive the interpolation word at a noninverting control input and the complement interpolation word at an inverting control input. By this arrangement, constituent amplifier circuits within mix amplifiers A and C are enabled while the corresponding constituent amplifier circuits within mix amplifiers B and D are disabled, and vice-versa. The outputs of mix amplifiers A and B are coupled together to supply a DRSS-level mix clock signal ($MCLK_{DRSS}$) to converter 425, and the outputs of mix amplifiers C and D are similarly coupled together to supply a DRSS-level complement mix clock signal (/$MCLK_{DRSS}$) to converter 425. Thus, mix amplifiers A and B each output a respective mix vector onto a first output line 424, and mix amplifiers C and D each output a respective complement mix vector onto a second output line 426. Converter 425 converts the DRSS-level mix clock signal and complement clock signal to CMOS-level mix clock signals, $MCLK_C$ and /$MCLK_C$.

The interpolation word, IW, and complement interpolation word, /IW, generated by the mix logic are used to control the relative drive strengths of the mix amplifiers A, B, C and D such that the resultant mix clock signals have phase offsets that fall within the range of phase angles bounded by the input mix vectors. As the interpolation word, IW, is incremented (and the complement interpolation word, /IW, correspondingly decremented), the phase angle of the mix clock signal is progressively stepped away from the leading mix vector and toward the trailing mix vector (i.e., mix clock signal is incrementally delayed). Conversely, as the interpolation word is decremented (and the complement interpolation word correspondingly incremented), the phase angle of the mix clock signal is progressively stepped away from the trailing mix vector and toward the leading mix vector (i.e., the mix clock signal is incrementally advanced). For example, in the case of a six bit interpolation word that is used to control the mixing of vectors $V_0$ (selected to be mix vector MV0) and $V_1$ (selected to be mix vector MV1), the interpolation word might initially be 0 such that the complement interpolation word is at a maximum value, thereby causing vector $V_0$ to be driven onto the $MCLK_{DRSS}$ output line by mix amplifier A at maximum drive strength and mix amplifier B to be disabled (i.e., a zero drive strength used to drive vector $V_1$ onto the $MCLK_{DRSS}$ output line). As the interpolation word, IW, is incremented (and the complement interpolation word, /IW, decremented), the drive strength of mix amplifier A is decreased and the drive strength of mix amplifier B is increased to adjust the phase of the resultant mix clock signal, $MCLK_{DRSS}$, away from vector $V_0$ and toward vector $V_1$. Eventually, when the interpolation word reaches a maximum value, the complement interpolation word applied to mix amplifier A will be 0 and a full drive strength (i.e., due to the maximum value interpolation word, IW) will be enabled within mix amplifier B. As a result, vector $V_1$ will be output as the mix clock signal, $MCLK_{DRSS}$ with zero contribution from vector $V_0$. If the count value within the mix logic is incremented further, the interpolation value will roll from a maximum value to a minimum value and the octant select value will be incremented to select a different pair of mix vectors. In the case of an increment beyond the $V_0/V_1$-bounded octant, vector $V_2$ will be selected by multiplexer M1 instead of vector $V_0$ such that mixing will now take place between vectors $V_2$ and $V_1$. The least significant bit of the octant select signal is applied to the multiplexers 441 and 443 within the ramp polarity selector 437 to cause the interpolation word, IW, to be decremented from a maximum value to a minimum value and the complement interpolation word, /IW, to be incremented from a minimum value to a maximum value.

FIG. 17 is a table that illustrates an exemplary relationship between the octant select signal 432, control signals S1 through S4, mix vectors MV0, MV1, /MV0 and /MV1, and the ramp polarity of the interpolation word, IW, and complement interpolation word, /IW. Starting with the first row of the table, when the octant select signal 432 is 0 (i.e., 000b), select signals S1–S4 are driven low (e.g., logic 0) resulting in selection of the '0' input port in multiplexers M1 and M2 and M3 and M4 of FIG. 16. Accordingly, multiplexer M1 passes vectors $V_0$ and /$V_0$ to the A and /A inputs of multiplexer M3 which, in turn, outputs vector A as mix vector MV0 and /A as mix vector /MV0. Similarly, multiplexer M2 outputs vector $V_1$ and /$V_1$ as vector B and /B, respectively, and multiplexer M4 outputs vector B and /B as mix vectors MV1 and /MV1, respectively. Thus, when the octant select signal 432 is 000, phase vectors $V_0$ and $V_1$ are selected to be mix vectors MV0 and /MV0, respectively, and phase vectors /$V_0$ and /$V_1$ are selected to be mix vectors MV1 and /MV1. Also because the least significant bit of the octant select signal 432 is 0, the ramp polarity of the interpolation word is positive; ramping from 0 to a maximum value ($2^N$−1).

Accordingly, mix amplifier B will initially receive a zero weight while mix amplifier A receives a maximum weight, causing the phase delay of the mix clock to be increased (i.e., stepped from vector $V_0$ toward vector $V_1$) in response to an increase in the count value within the mix logic. When the octant select signal 432 is incremented from 000 to 001, select signal S1 goes high to select vectors $V_2$ and $/V_2$ instead of vectors $V_0$ and $/V_0$. Consequently, mix amplifiers A and B will now mix vectors $V_1$ and $V_2$ and mix amplifiers C and D will mix vectors $/V_1$ and $/V_2$. Because the least significant bit of the octant select signal 432 is now a one, multiplexers 441 and 443 within the ramp polarity selector will select a complemented version of the interpolation value 442 to be the interpolation word, IW, and an uncomplemented version of the interpolation value 442 to be the complement interpolation word, /IW. Thus even though the interpolation word value has rolled over from a maximum value to zero in response to incrementing the count value within the mix logic, a maximum weight is still applied to inverter B and a minimum weight is applied to inverter A. As a result, mix amplifier B initially drives vector $V_1$ onto the mix clock signal output line at full strength, while mix amplifier A is disabled. As the interpolation value 442 is incremented, the weight applied to mix amplifier B is decreased (ramp polarity of IW is negative) and the weight applied to mix amplifier A is increased (ramp polarity of /IW is positive) such that the interpolation between vectors $V_1$ and $V_2$ is stepped toward vector $V_2$ and away from vector $V_1$. Referring to the table of FIG. 17 it can be seen that each of the different octant select values 000 through 111 (0 through 7, decimal) selects an incrementally different pair of phase vectors that bound an incrementally different octant within an overall cycle of a reference clock signal. Thus, vectors $V_0$ and $V_1$ are initially selected, vectors $V_1$ and $V_2$ are selected thereafter, then vectors $V_2$ and $V_3$, then vectors $V_3$ and $/V_0$ and so forth ultimately to vectors $/V_3$ and $V_0$. The foregoing assumes an incremented count value within the mix logic 417. If the count value is decremented, the octants are traversed in the opposite direction. Also, the interpolation word, IW, is alternately ramped up from 0 to a maximum value and then back down from the maximum value to zero with each transition of the least significant bit of the octant select signal 432. The ramp polarity of the complement interpolation word, /IW, is opposite that of the interpolation word, IW, and therefore is similarly alternated between positive and negative ramp polarities with each toggling of the least significant bit of the octant select signal 432.

FIG. 18 illustrates an embodiment of a multiplexer 461 that may be used to implement any of multiplexers M1–M4 of FIG. 16. The multiplexer 461 includes four tri-state inverter circuits A, B, C and D, each of which receives a corresponding input vector, $V_A$, $V_B$, $V_C$ and $V_D$. The outputs of inverters A and C are coupled to an output line 462 to output either vector $V_A$ or vector $V_C$ as output vector $V_{OUT1}$. The output of inverters B and D are similarly coupled to an output line 464 to output either vector $V_B$ or vector $V_D$ as output vector $V_{OUT2}$. Inverters A and C are enabled by a logic low select signal 463 (S), and logic high complement select signal 465 (/S), and inverters B and D are alternately enabled when the select signal 463 is high and the complement select signal 465 is low. Accordingly, when select signal 463 is low and complement select signal 465 is high, inverters A and B are enabled, and inverters C and D are disabled. Consequently, input vector $V_A$ is output as vector $V_{OUT1}$, and input vector $V_B$ is output as vector $V_{OUT2}$. Conversely, when select signal 463 is high and complement select signal 465 is low, inverters A and B are disabled and inverters C and D are enabled so that input vector $V_C$ is output as vector $V_{OUT1}$ and input vector $V_D$ is output as vector $V_{OUT2}$. Note that while the multiplexers M1–M4 of FIG. 16 are depicted as having single ended control signals, S1–S4, respectively, complementary control signals may alternatively be used as in multiplexer 461.

FIG. 19 illustrates a DRSS mix amplifier 471 according to an embodiment of the invention. The DRSS mix amplifier 471 may be used, for example, to implement mix amplifiers A–D within circuit block 423 of FIG. 16. The mix amplifier 471 includes N tri-state inverters each having a binary weighted drive strength ranging from 1 to $2^{N-1}$ in multiples of 2 (i.e., drive strength=1, 2, 4, 8, . . . $2^{N-1}$). The value of N corresponds to the number of bits in the interpolation word (and complement interpolation word) and is 6 in the exemplary embodiment of FIG. 19. Accordingly, the tri-state inverters are designated ×1, ×2, ×4, ×8, ×16 and ×32 in FIG. 19 to indicate their relative drive strengths. In one embodiment, the different drive strengths of the inverters are achieved by using different width transistors within each inverter. For example, if the constituent transistors of the ×1 inverter have widths, W, the transistors of the ×2 inverter have widths, 2 W, the transistors of the ×4 inverter have widths, 4 W, and so forth. In alternative embodiments, other transistor characteristics (including a combination of characteristics) may be changed to achieve the binary weighted drive strengths.

Each of the tri-state inverters within the mix amplifier 471 is enabled by respective bit of the interpolation word, IW, and complement interpolation word, /IW. For example, if bit 0 of the interpolation word (i.e., IW0) is high and its complement (/IW0) is low, the ×1 inverter will be enabled to drive the input mix vector, MV, onto the output signal line 472. Note that the interpolation word and complement interpolation word connections shown in FIG. 19 correspond to the connections for mix amplifiers B and D of FIG. 16 and are reversed for mix amplifiers A and C. The ×2 inverter is similarly enabled by IW1 and /IW1, the ×4 inverter by IW2 and /IW2, the ×8 inverter by IW3 and /IW3, the ×16 inverter by IW4 and /IW4, and the ×32 inverter by IW5 and /IW5. By this arrangement, as the interpolation word is incremented (and the complement decremented), the ×1, ×2, ×4, ×16 and ×32 inverters are turned on in a binary pattern to produce a total mix amplifier drive strength that ranges from zero to 63 in steps equal to the strength of the ×1 inverter.

The tri-state inverters within the DRSS mix amplifier 471 are powered by the regulated supply voltages, REG+ and REG−, generated by the dual rail regulation circuit within the DRSS reference loop. Consequently, by sizing the tri-state inverters such that the full scale drive strength of the mix amplifier 471 is equal (or substantially equal) to the drive strength of a delay element within the DRSS reference loop (i.e., one of the delay elements A–E within delay lines 363 and 365 of FIG. 13), the full-scale slew rate of the mix amplifier 471 may be aligned with the slew rate of the reference loop delay element. For example, by establishing the drive strength of the ×32 inverter (e.g., by transistor width selection) to be half the drive strength of a 45 degree delay element within the DRSS reference loop, then the full scale drive strength of the mix amplifier 471 will be substantially equal to the drive strength of the 45 degree delay element (i.e., 32+×16+×8+×4+×2+×1=×63≅2 times ×32), and the full scale mix amplifier output will cross the regulated common mode voltage at the 45 degree interval. Thus, as shown in FIG. 20, a leading mix vector 478 and trailing mix vector 480 may be incrementally stepped through their respective interpolation weights with the weight applied to the mix amplifier for the leading vector 478 incrementally decreased and the complement weight applied to the mix amplifier of the trailing vector 480 incrementally increased such that the output drive strength of the leading vector is incrementally decreased and the output drive strength of the trailing vector is incrementally increased. The result is a progression of phase steps from the leading vector 478 to the trailing vector 480. Because of the drive strength correspondence between the mix amplifiers and reference loop delay elements, when the full interpolation weight is initially on the leading vector 478 (with zero weight applied to the trailing vector), the resultant mix clock corresponds to the leading vector 478 and the regulated common mode voltage crossing occurs 45 degrees after the leading vector 478 begins to transition. With each increment of the interpolation word, IW (and corresponding decrement of the complement interpolation word, /IW), the drive strength of the leading vector 478 is decreased, causing the slope of the leading vector to fall incrementally such that when the 45 degree time is reached, the mix clock output has not yet reached the regulated common mode voltage. At the 45 degree time, the trailing vector 480 begins to contribute to the output mix vector, thereby increasing the drive strength to that of a full strength inverter. Consequently, a substantially linear phase step is achieved with each increment of the interpolation weight. Ultimately, the interpolation weight applied to the leading vector 478 is decremented to zero, so that no ramping of the mix clock occurs until 45 degree time when the trailing vector 480 begins to transition. Thus, mixing occurs in a substantially linear manner between leading and trailing vectors.

Phase Jumping

Because the DRSS mixer described in reference to FIGS. 16–18 exhibits relatively fast settling time between phase steps (i.e., as compared to DAC output to high impedance load described in reference to FIG. 3), a number of applications which require rapid, relatively large, phase changes become possible. For example, in an application in which the DRSS mixer is used to generate a transmit clock (i.e., to time transmission of signals), it may be desirable to select a different phase offset between the transmit clock and a reference clock signal according to a data (and clock) propagation distance. More specifically, a respective offset control value (OCTL) may be established for each recipient device in a signaling system and selected (e.g., from a lookup table or other memory) by a transmitting device according to which recipient device is the intended recipient of an outgoing transmission. Because the transmitting device may need to transmit to one or more different recipient devices in rapid succession, delay in generating transmit clock signals having the desired phase offsets would present a substantial bottleneck in such a system. Using the DRSS mixer of FIG. 16, a sequence of transmit clocks having different phase offsets may be rapidly generated by changing the offset control value 262 (OCTL). This type of operation is referred to herein as destination-based phase jumping. While some settling time in the resultant mix clock signal is still necessary, the settling time is, in general, substantially shorter than in the prior art mixer described above.

Embodiments of the present invention may also be used to achieve a rapid succession of different phase alignments of a sampling clock signal, with each different phase alignment corresponding to a respective transmission source within a signaling system. For example, in a master/slave system in which slave transmissions to a master device occur deterministically in response to master device commands or requests (i.e., when the master device issues a command or request, the master device may anticipate a responsive transmission from the slave a predetermined time later), the master device may select a previously determined sampling clock offset according to which slave device is scheduled to transmit at a given time. Such operation is referred to herein as source-based phase jumping and may be implemented within a master device, for example, by storing a respective offset control value (OCTL) for each slave device in a signaling system and selecting (e.g., from a lookup table or other memory) different ones of the stored offset controlled values according to the identities of the slave devices scheduled to transmit. More generally, source-based phase jumping may be used in any device that has or receives forehand information of transmission sources. Such forehand information may result from system determinism (i.e., predetermined response times to system events such as commands, requests, interrupts, timing signals, etc.) or from other communications including, without limitation, communications via out-of-band signaling channels (e.g., handshaking signals).

Both destination and source-based phase jumping may be implemented within the same integrated circuit device (e.g., one or more master devices within a master/slave system) and a shared memory structure used to store offset control values for the various transmission destinations and sources. Offset control values may be determined, for example, by transmission of predetermined test patterns between system devices to learn the leading and lagging phase boundaries beyond which transmission errors are detected. Methods and apparatuses for performing such timing calibration operations are disclosed, along with other locked-loop applications in which embodiments of the present invention may be used, in U.S. patent application Ser. No. 09/421,073, filed Oct. 19, 1999 (entitled "Bus System Optimization"), and U.S. Pat. No. 6,321,282, each of which is hereby incorporated by reference in its entirety.

Embodiments of the present invention may also be applied to achieve destination and/or source-based phase jumping in signaling systems in which integrated circuit devices (or components within an integrated circuit device) are clocked by different clock signals having nominally the same frequency, but arbitrary phase relationships. In such a system, the phase offsets between various transmit and sampling clock signals used to time signal transmission and reception may be systematically determined and used to generate offset control values. The offset control values may then be dynamically retrieved (e.g., from a lookup table or other memory) to time data reception and/or transmission operations in one or more of the integrated circuits according to the source or destination of the data transmission. In one such system, for example, a memory controller mounted to a motherboard (or other substrate) is coupled to multiple memory modules (i.e., daughterboards or other substrates having one or more integrated circuit memory devices mounted thereon) via a common signaling path, the memory modules being clocked by respective clock signals having nominally the same frequency, but arbitrary phase relationships. The memory controller may receive any or all of the clock signals provided to the memory modules, and/or a separate clock signal. In one embodiment, the memory controller includes a DLL circuit or PLL circuit according to the present invention to achieve rapid, source and/or destination-based phase jumping.

The phase jumping capability of the DRSS mixer of FIG. 16 may also be applied in phase locking operations performed upon device power up or exit from a reduced power state. In phase locking operations, the phase of a sampling clock signal and/or transmit clock signal generated by a locked loop circuit (i.e., DLL or PLL) is incrementally rotated through a cycle (or part of a cycle) of a reference clock signal until a desired phase offset is reached. The phase jumping operation of the DRSS mixer may be used to jump between different phases in search of the desired phase offset, for example, in a binary search in which the search range is repeatedly halved to converge on the desired phase offset. Alternatively, a combination of binary and linear searching techniques may be used, for example, by using a binary search to reduce the search range to a predetermined phase range, then stepping through the predetermined phase range in linear increments until a desired phase offset is reached. In general, any searching technique in which it is desirable to rapidly switch between different phase offsets may potentially benefit from the short settling time of the DRSS mixer of FIG. 16.

Avoiding Transient Phase Errors Due to Mix Amplifier Switching

Referring to FIG. 19, incrementally increasing the drive strength of the mix amplifier 471 will, in some instances, involve enabling one tri-state inverter while simultaneously disabling others. For example, to increment the drive strength of the mix amplifier from a ×31 to a ×32 drive strength, the ×32 inverter is enabled, while the ×1, ×2, ×4 and ×16 inverters are all disabled. Because the enabling of the ×32 inverter may not happen at precisely the same instant as the disabling of the lower strength inverters, the drive strength of the mix amplifier may, for a brief interval, be erroneously high or low. As shown in FIG. 21, for example, if the ×32 inverter is enabled faster than the other inverters are disabled, a transient, high spiking drive strength will occur, producing a transient phase error.

Figures 22, 23, 24:
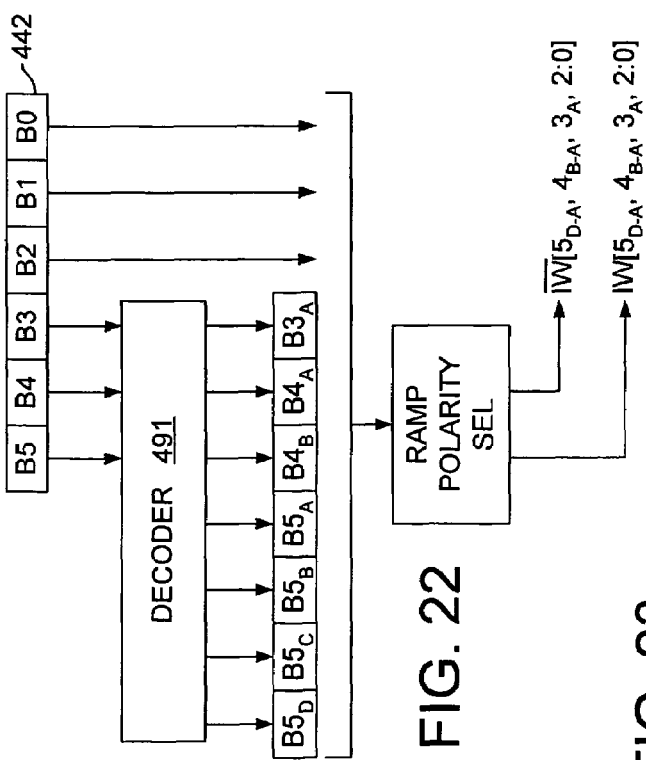
FIG. 22 illustrates a decoder circuit to thermometer code selected bits of a phase vector interpolation value according to an embodiment of the invention.
FIG. 23 is a table that illustrates an exemplary decoding of selected bits of an interpolation value.
FIG. 24 illustrates a mix amplifier according to an alternative embodiment of the invention.

In one embodiment of the invention the most significant bits of the interpolation value 442 of FIG. 16 are thermometer coded so that none of the most significant bits are simultaneously turned on and off. Referring to FIG. 22, for example, the three most significant bits of a 6-bit interpolation value 442 (i.e., bits B3, B4 and B5) are input to a decoder circuit 491 which generates decoded bits, $B5_A$–$B5_D$, $B4_A$, $B4_B$ and $B3_A$, that correspond to eight possible values represented by the most significant three bits of the interpolation word. FIG. 23 is a table that illustrates an exemplary decoding of the most significant three bits of the interpolation value 442 and FIG. 24 illustrates a mix amplifier 500, according to an alternative embodiment of the invention, that responds to the decoded interpolation value after it is passed through the ramp polarity selector 437 to generate a interpolation word, IW, and complement interpolation word, /IW (note that the interpolation word and complement interpolation word connections are opposite those shown in FIG. 24 for mix amplifiers A and C of FIG. 16). In the mix amplifier 500, the ×32 inverter has been replaced by four ×8 inverters each of which is enabled by a respective one of bits $IW5_A$ through $IW5_D$ of the interpolation word, IW (and by bits $/IW5_A$ through $/IW5_D$ of the complement interpolation word, /IV). Similarly, the ×16 inverter has been replaced by two ×8 inverters that are enabled by respective bits $IW4_A$ and $IW4_B$ of the interpolation word, IW (and complement bits $/IW4_A$ and $/IW4_B$). Bits B3, B4 and B5 of the interpolation value 442 effectively indicate the number of ×8 inverters within mix amplifier 500 to be enabled. For example, when B3–B5 are all 0, all the ×8 inverters are disabled (i.e., tri-stated). When B3 is high, decoded control bit $IW3_A$ goes high (and the complement bit, $/IW3_A$, low) to enable the corresponding ×8 inverter, 503. All the other ×8 inverters remain disabled. When bit B4 goes high (indicating that a ×16 drive strength is needed), an additional ×8 inverter $504_A$ is enabled by decoded control bit $IW4_A$ and its complement. Note that in the mix amplifier of FIG. 18, the ×16 inverter is enabled and the ×8 inverter disabled simultaneously to achieve a ×16 drive strength. Thus, the race between the ×16 enable and ×8 disable in the mix amplifier of FIG. 18 is avoided in the mix amplifier of FIG. 24, as the ×8 inverter 503 remains enabled while an additional ×8 inverter $504_A$ is enabled to achieve the ×16 drive strength. When bits B3 and B4 of the interpolation value 442 are both high (indicating a total drive strength of ×2 4), another ×8 inverter $504_B$ is enabled by decoded control bits IW4B, so that three ×8 inverters are enabled to achieve the ×24 drive strength. The ×8 inverters 503, $504_A$, $504_B$, $505_A$, $505_B$, $505_C$ and $505_D$ are incrementally turned on in this manner to produce a drive strength that ranges from 0 times ×8 (B3–B5=000) to eight times ×8 (B3–B5=111). Referring to the table of FIG. 23, it can be seen that only one decoded control bit changes state at a time, and therefore only one ×8 inverter is enabled or disabled at a time, as the drive strength is incremented through the different states of the B3–B5 signals. By this arrangement, race conditions between on and off transitions of high drive strength inverters may be avoided, thereby reducing the likelihood and severity of transient phase errors. In alternative embodiments, more or less decoding may be provided such that there are more or fewer constituents inverters within the mix amplifier 500 of FIG. 24. For example, more or fewer of the most significant bits of the interpolation value 442 may be decoded to generate a set of interpolation control signals.

Charge Pump with Common Mode Feedback

Figure 25:
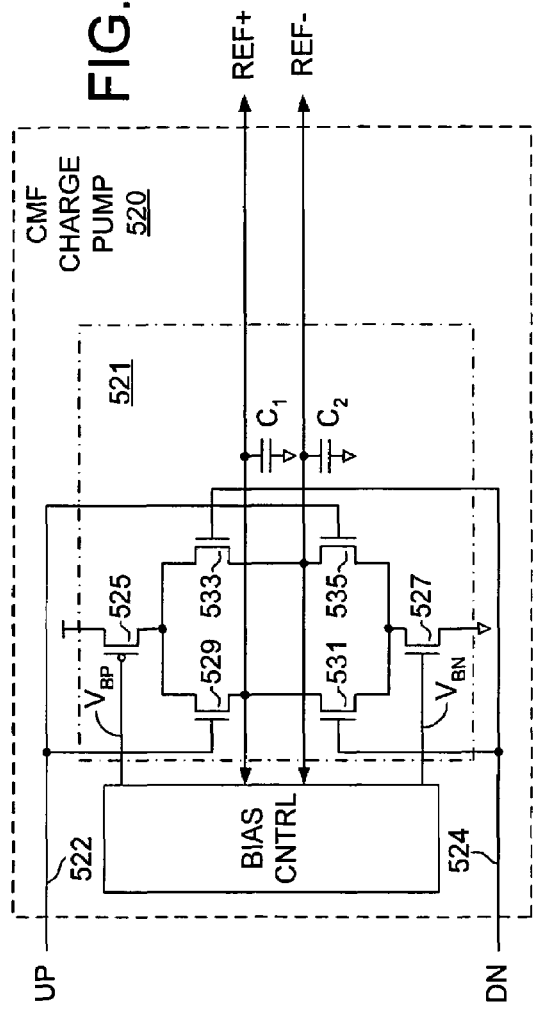
FIG. 25 illustrates a common-mode-feedback charge pump according to an embodiment of the invention.

FIG. 25 illustrates a common-mode-feedback (CMF) charge pump 520 according to an embodiment of the invention. The charge pump 520 may be used, for example, to implement charge pump 373 within the dual rail regulation circuit 361 of FIG. 13. The charge pump 520 includes a charging circuit 521 and a bias control circuit 523. The charging circuit 521 includes current sourcing transistor 525 and current sinking transistor 527, capacitive elements $C_1$ and $C_2$, and switching transistors 529, 531, 533 and 535. Switching transistors 529 and 533 are coupled between the current sourcing transistor 525 and capacitive elements, $C_1$ and $C_2$, respectively, while switching transistors 531 and 535 are coupled between the current sinking transistor 527 and the capacitive elements, $C_1$ and $C_2$, respectively. Also, gate terminals of switching transistors 529 and 535 are coupled to a first signal line 522 to receive a first component signal of a voltage control signal (i.e., up signal, UP), and gate terminals of switching transistors 531 and 533 are coupled to a second signal line 524 to receive a second component signal of the voltage control signal (i.e., down signal, DN). By this arrangement, when the up signal is high, indicating that the potential between reference voltages, REF+ and REF−, is to be increased, transistor 529 is switched on to couple capacitive element $C_1$ to the current sourcing transistor 525, and transistor 535 is switched on to couple capacitive element $C_2$ to the current sinking transistor 527. Because the down signal is deasserted (i.e., low), transistors 531 and 533 are switched off. Consequently, capacitive element $C_1$ is charged to a higher potential by the current sourcing transistor 525, and capacitive element $C_2$ is discharged to a lower potential by the current sinking transistor 527. That is, REF+ is increased and REF− is decreased when the up signal is asserted on line 522. Conversely, when the down signal is asserted on line 524 (and the up signal deasserted), transistors 531 and 533 are switched on to discharge the capacitive element $C_1$ via the current sinking transistor 527 and to charge the capacitive element $C_2$ via the current sourcing transistor 525 (transistors 529 and 535 are switched off by the deasserted up signal), thereby decreasing REF+ and increasing REF−. Referring to FIG. 13, because the regulated voltages, REG+ and REG−, track the reference voltages REF+ and REF−, the assertion of the up and down signals by phase detector 371 increases and decreases, respectively, the rail-to-rail regulated voltage output by the dual rail regulation circuit 361. Because an increased rail-to-rail regulated voltage shortens the delay through the delay lines 363 and 365 of the reference loop 360, assertion of the up signal produces a phase advance in the output of the nominally 360 degree phase vector, reducing the phase lag which resulted assertion of the up signal by the phase detector 371. Conversely, a decreased rail-to-rail regulated voltage increases the delay through the delay lines 363 and 365 of the reference loop 360, so that assertion of the down signal retards the phase of the 360 degree clock cycle, reducing the phase lead which resulted in assertion of the down signal by the phase detector 371. Thus, the overall operation of the common mode feedback charge pump in response to the up and down signals from the phase detector 371 is a negative feedback operation in which the delay through the delay elements within the reference loop is increased if the 360 degree phase vector leads the 0 degree phase vector and decreased if the 360 degree phase vector lags the 0 degree phase vector.

Referring again to FIG. 25, the bias control circuit 523 is coupled to the capacitive elements $C_1$ and $C_2$ to receive the reference voltages REF+ and REF−, respectively, and outputs a bias voltage $V_{BP}$ to the current sourcing transistor 525 and a bias voltage $V_{BN}$ to the current sinking transistor 527. The bias control circuit 523 adjusts the bias voltages $V_{BP}$ and $V_{BN}$ as necessary to maintain the common mode of the REF+ and REF− signals (i.e., the regulated common mode voltage) substantially equal to the CMOS common mode voltage. That is, the bias control circuit 523 biases the current sinking and current sourcing transistors 527 and 525 to ensure that the peak-to-peak swing of DRSS-level signals is symmetric with respect to the signal swing of CMOS-level signals.

Figure 26:
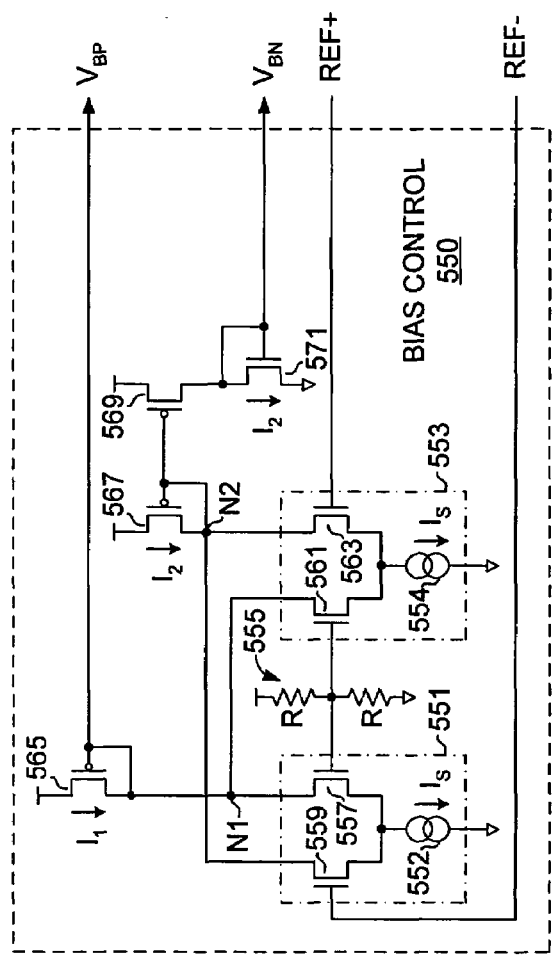
FIG. 26 illustrates a bias control circuit according to an embodiment of the invention.

FIG. 26 illustrates a bias control circuit 550 according to an embodiment of the invention. The bias control circuit 550 may be used, for example, to implement the bias control circuit 523 of FIG. 25. The bias control circuit 550 includes a pair of differential amplifiers 551 and 553 each biased by a respective current source 552 and 554 which draws current, $I_S$. A resistor divider circuit 555 is coupled between $V_{DD}$ and ground to generate a CMOS common mode reference signal (e.g., $V_{DD}/2$) which is applied to the gate terminal of a transistor within each differential amplifier 551 and 553 (i.e., to the gate terminals of transistors 557 and 561). Also, the upper and lower reference voltages, REF+ and REF−, are coupled to the gate terminals of transistors 563 and 559, respectively, of each of the differential amplifiers 553 and 551. The drain terminal of transistor, designated node N1 in FIG. 26, is coupled to the drain terminal of diode-configured transistor 565 and to the drain terminal of transistor 561. The drain terminal of transistor 563, designated node N2 in FIG. 26, is coupled to the drain terminal of diode-configured transistor 567 and also to the drain terminal of transistor 559. Current $I_1$ flows through diode-configured transistor 565 according to the transconductance of the differential amplifier 551 and the difference between the REF− voltage and the CMOS common mode reference voltage. Because diode-configured transistor 565 is coupled in a current mirror configuration with the current sourcing transistor 525 of FIG. 25, the bias voltage developed at the gate of transistor 565 (i.e., voltage $V_{BP}$) will appear at the gate terminal of the current sourcing transistor 525 such that the current sourcing transistor 525 delivers charging current $I_1$ to either capacitive element $C_1$ or $C_2$ according to whether the up signal or the down signal is asserted. Current $I_2$ flows through diode-configured transistor 567 according to the transconductance of the differential amplifier 553 and the difference between the REF+ voltage and the CMOS common mode reference voltage. Transistor 567 is coupled in a current mirror configuration with transistor 569 which itself is coupled, at a drain terminal, to diode-configured transistor 571. Accordingly, current $I_2$ also flows through transistors 569 and 571, thereby developing voltage $V_{BN}$ at the gate terminal of transistor 571. Because transistor 571 is coupled in a current mirror configuration with current sinking transistor 527 of FIG. 25, bias voltage $V_{BN}$ is applied to the gate of transistor 527, thereby causing transistor 527 to draw current 12 from either capacitive element $C_1$ or $C_2$ according to whether the up signal or the down signal is asserted. Current $I_2$ may be expressed as a function of the transconductance of the differential amplifiers (G), the bias currents ($I_S$) and the differential inputs as follows:

$$I_2 = [I_S/2 + G(REF^+ - V_{DD}/2)] + [I_S/2 + G(REF^- - V_{DD}/2)] = I_S + G((REF^+ + REF^-) - 2V_{DD}/2) = I_S + 2G(REF_{CM} - V_{DD}/2), \text{ where } REF_{CM} = (REF^+ + REF^-)/2$$

Current I1 may similarly be expressed as a function of differential amplifier gains, bias currents and differential inputs as follows:

$$I_1 = [I_S/2 + G(V_{DD}/2 - REF^+)] + [I_S/2 + G(V_{DD}/2 - REF^-)] = I_S + G(2V_{DD}/2 - (REF^+ + REF^-)) = I_S + 2G(V_{DD}/2 - REF_{CM})$$

Thus, currents $I_1$ and $I_2$ are each dependent on the difference between the CMOS common mode voltage, $V_{DD}/2$, and the regulated common mode voltage, $REF_{CM}$. Also, referring to FIG. 25, the regulated common mode voltage is determined by the time averaged difference between the current delivered by current sourcing transistor 525 (i.e., $I_1$) and the current drawn by current sinking transistor 527 (i.e., $I_2$). If $I_1$ is greater than $I_2$, the regulated common mode voltage will increase, thereby producing negative feedback to reduce $I_1$ and increase $I_2$. Conversely, if $I_2$ is greater than $I_1$, the regulated common mode will decrease, thereby producing negative feedback to reduce $I_2$ and increase $I_1$. The overall effect of the negative feedback within the bias control circuit 550 is to stabilize $I_1$ and $I_2$ at equal values when the regulated common mode voltage, $REF_{CM}$, is equal (or substantially equal) to the CMOS common mode voltage, $V_{DD}/2$.

Linear Regulator

Figure 27:
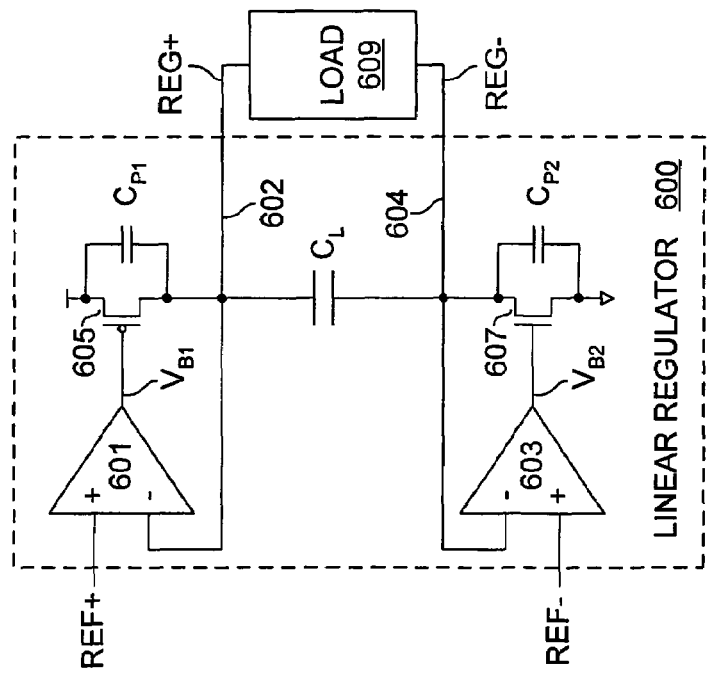
FIG. 27 illustrates a linear regulator according to an embodiment of the invention.

FIG. 27 illustrates a linear regulator 600 according to an embodiment of the invention. The linear regulator 600 may be used, for example, to implement the linear regulator 375 of FIG. 13. The linear regulator 600 includes a pair of differential amplifiers 601 and 603, each coupled in a follower configuration to respective bias voltages, $V_{B1}$ and $V_{B2}$. Bias voltage $V_{B1}$ is applied to a gate terminal of current sourcing transistor 605 and bias voltage $V_{B2}$ is applied to a gate terminal of current sinking transistor 607 to generate regulated voltages, REG+ and REG−, that are substantially equal to the REF+ and REF− voltages generated by the common mode feedback charge pump. The regulated voltages, REG+ and REG−, are applied to a load circuit 609 that includes, for example the delay elements that form the delay lines within the DRSS reference loop, and the mix amplifiers within the DRSS mixers. That is, the follower configuration of the amplifiers 601 and 609 will drive the gate voltages of transistors 605 and 607 to provide current to the load 609 as necessary to maintain equality between the regulated voltages, REG+ and REG−, and the reference voltages, REF+ and REF−, respectively. A noninverting terminal of amplifier 601 is coupled to receive the reference voltage, REF+, and an inverting terminal of the amplifier 601 is coupled to the REG+ output line 602. The output of the amplifier 601 is coupled to the gate terminal of current sourcing transistor 605. Similarly, differential amplifier 603 includes a noninverting terminal coupled to receive the REF− voltage and an inverting terminal coupled to the REG− output line 604. The output of the amplifier 603 is coupled to the gate terminal of the current sinking transistor 607. Each of the current sourcing and current sinking transistors 605 and 607 has some parasitic capacitance, depicted in FIG. 27 as capacitive elements $C_{P1}$ and $C_{P2}$. A capacitive element, $C_L$, is coupled in parallel with the load 609 to absorb transient spikes in the regulated voltages, REG+ and REG−. In one embodiment, $C_L$ is chosen to have significantly higher capacitance than parasitic capacitances $C_{P1}$ and $C_{P2}$.

Figure 28:
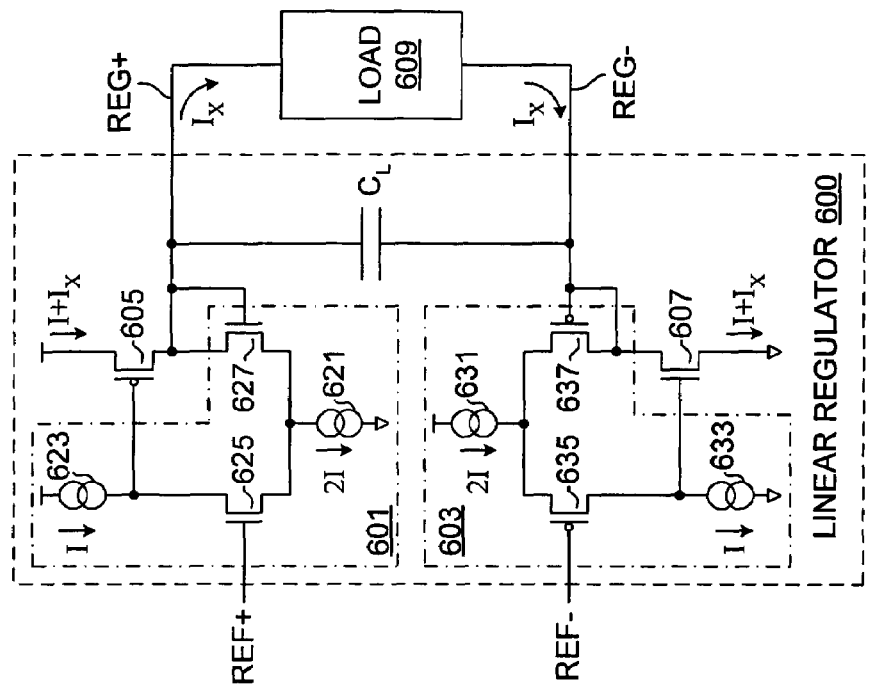
FIG. 28 illustrates an embodiment of the linear regulator of FIG. 27 in greater detail.

FIG. 28 illustrates an embodiment of the linear regulator 600 in greater detail. The linear regulator 600 includes the two differential amplifiers 601 and 603, capacitive element, $C_L$, and current sourcing/sinking transistors 605 and 607 discussed above. The differential amplifier 601 includes a first current source 621 which draws current 2I from the source terminals of the differential transistor pair (i.e., transistors 625 and 627). A second current source 623 generates current, I, which flows through transistor 625 and therefore delivers half the bias current drawn by the current source 621. Current sourcing transistor 605 is coupled in a follower configuration to the differential amplifier (i.e., gate terminal of transistor 605 coupled to the drain terminal of transistor 625, and source terminal of transistor 605 coupled to the gate terminal of diode-configured transistor 627). Current I flows through diode-configured transistor 627, by virtue of the first current source 621 (which draws 2I) and the second current source 623, which sources I through the transistor 625. Accordingly, the REG+ voltage developed at the gate terminal of transistor 627 follows (i.e., is substantially equal to) the REF+ input signal. The load 609 draws a time-varying current, $I_X$, so that the voltage at the drain terminal of the transistor 625 (the output of the differential amplifier 601) is developed as necessary to source current $I+I_X$ via transistor 605, thereby maintaining current I through the transistor 627 and, therefore, maintaining equality (or substantially so) between the regulated output voltage, REG+, and the reference signal, REF+, regardless of the current $I_X$ drawn by the load 609.

The differential amplifier 603 includes a first current source 631 which sources current 2I to the source terminals of differentially coupled transistors 635 and 637, and a second current source 633 which sinks current I via transistor 635. By this arrangement, half the current generated by current source 631 (i.e., current I) flows through transistor 637, thereby causing the regulated voltage, REG−, developed at the gate terminal of transistor 637 to follow the REF− input signal. The current sinking transistor 607 is coupled in a follower configuration with the differential amplifier 603 (i.e., gate terminal of transistor 607 coupled to the drain terminal of the transistor 635, and source terminal of transistor 607 coupled to the gate terminal of the diode-configured transistor 637), drawing current $I_X$ from the load 609 and current I from the first current source via transistor 637. Thus, the voltage at the drain of transistor 635 is developed as necessary to bias transistor 607 to sink current $I+I_X$, thereby maintaining current I through transistor 637 and, therefore, maintaining equality (or substantially so) between the regulated output voltage, REG−, and the reference signal, REF−, regardless of the current $I_X$ drawn from the load 609. Capacitor $C_L$ is coupled in parallel with the load 609 to dampen transient voltage changes as discussed above.

Reflecting on the operation of the linear regulator of FIG. 28, it should be noted that the differential amplifiers 601 and 603 for the linear regulator 600 are implemented using only a single amplifier stage. As a result, the unity gain feedback configuration yields a single-pole feedback system. Thus, the need for special stability compensation techniques of higher ordered systems (e.g., systems with two or more poles) is unnecessary.

It should be noted that the DRSS locked loop architecture described in reference to FIGS. 7–28 can be implemented with either a delay locked loop (DLL) or phase locked loop (PLL) version of a DRSS reference loop. For example, a PLL implementation of a DRSS reference loop would differ from the DRSS reference loop 360 of FIG. 13 primarily in the charge pump circuit (also called a loop filter), where a two-stage filter may be used to stabilize the two pole system (i.e., phase and frequency). Clock divider circuitry may be used within the reference loop to generate frequency-multiplied phase vectors. Also, referring to FIG. 13, the reference clock signal, $CLK_{DRSS}$, would be provided to one input of the phase detector 371 and the free running clock generated by the delay line (e.g., the 360 degree phase vector) provided to the other input of the phase detector. In either type of DRSS reference loop, DLL or PLL, the regulated voltages REG+ and REG− used to lock the reference loop are supplied to mix amplifier circuits within a mixer circuit (e.g., elements $253_1$ and/or $253_2$ of FIG. 7) to provide rapid, substantially linear mixing between a selected pair of phase vectors.

System Application of Locked Loop Circuit

Figure 29:
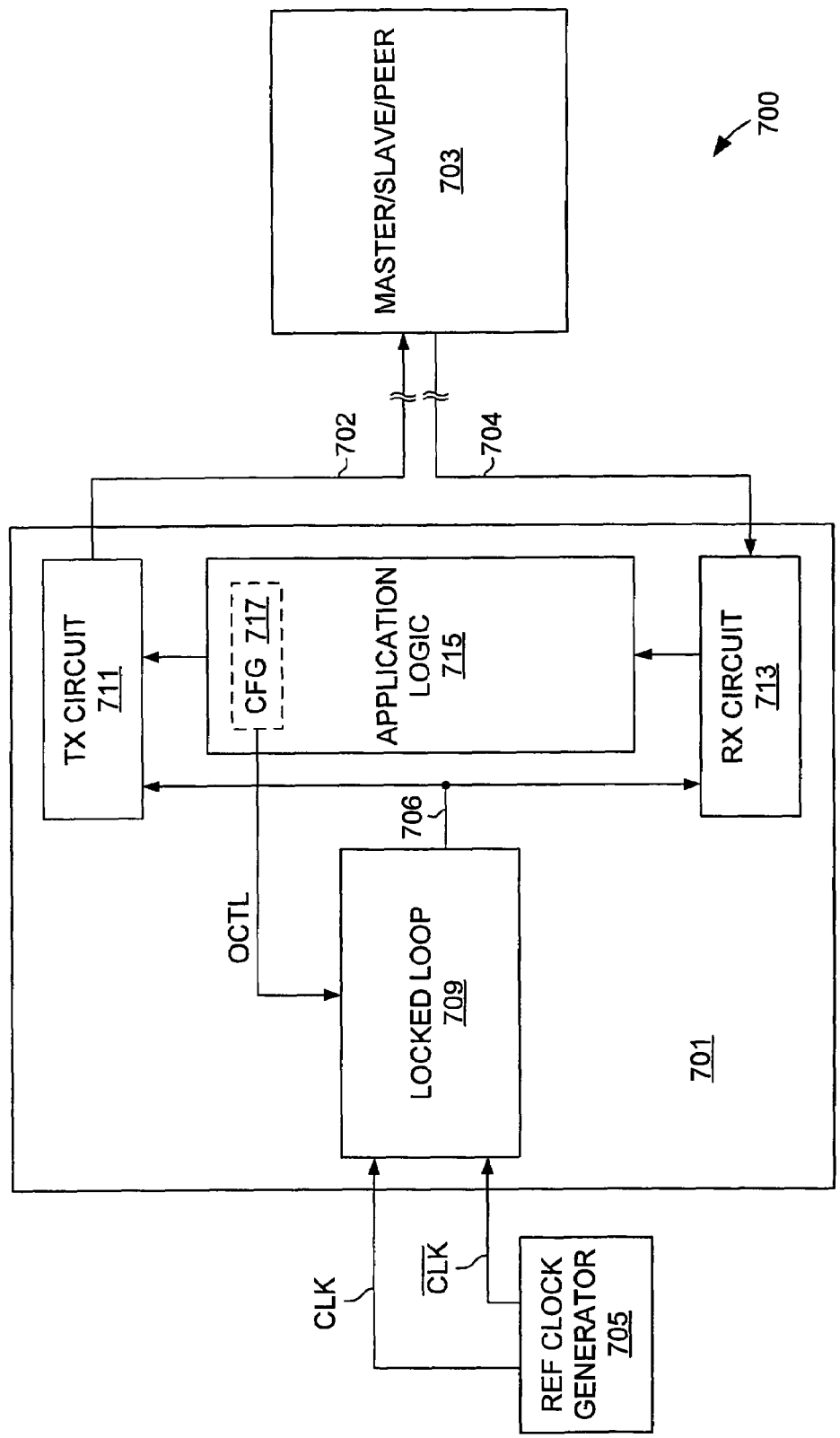
FIG. 29 illustrates a system 700 in which a locked loop circuit according to embodiments of the invention may be used.

FIG. 29 illustrates a system 700 in which a locked loop circuit 709 (i.e., a DLL or PLL circuit) according to embodiments described above in reference to FIGS. 7–28 may be used. The system 700 may be used, for example, within a computing device (e.g., mobile, desktop or larger computer), networking equipment (e.g., switch, router, etc.), consumer electronics device (e.g., telephone, camera, personal digital assistant (PDA), etc.), or any other type of device in which a PLL or DLL circuit may be used. More specifically, the system 700 may be a memory subsystem or any other subsystem within such computing device, networking equipment, consumer electronics device, etc.

The system 700 includes a pair of integrated circuits (ICs) 701 and 703 coupled to one another via a transmit signal path 702 and a receive signal path 704. In the embodiment shown, the signal paths 702 and 704 are unidirectional high-speed serial links for conducting serialized transmissions from one IC to the other. In alternative embodiments, either or both of the links may be bi-directional (i.e., with appropriate circuitry provided to select which of the ICs is enabled to transmit on the link at a given time), and multiples of such signal paths may be provided to enable transmission of parallel groups of bits (e.g., each group of bits forming a data or control word (e.g., command, address, etc.) or portion of a data or control packet). Also, the transmit signal path 702, receive signal path 704, and/or shared transmit-receive signal path may be a multi-drop bus that is coupled to additional ICs. The ICs 701 and 703 may be peers (e.g., each IC is capable of independently initiating a signal transmission to the other), or master and slave. Also, the relative status of the ICs 701 and 703 may change from time-to-time such that one IC is a master at a first time, then a slave at another time, and/or a peer at another time.

IC 701 is shown in simplified block diagram form and includes a transmit circuit 711, receive circuit 713, locked loop circuit 709, and application logic 715. As shown, the locked loop circuit 709 is coupled to receive complementary reference clock signals, CLK and /CLK, from an off-chip reference clock generator 705, and outputs a phase-locked clock signal 706 to the transmit circuit 711 and the receive circuit 713. In alternative embodiment, the reference clock signals, CLK and /CLK, may be generated within IC 701 or IC 703. A configuration circuit 717 (e.g., register, one-time programmable circuit, non-volatile memory, etc.) may be included within the application logic 715 to store one or more offset control values that are used to establish a phase offset between clock signal 706 and reference clock signal, CLK. Note that clock signal 706 may include a complementary pair of clock signals as described above. Also, while the locked loop 709 is depicted as providing a clock signal to both the transmit circuit 711 (i.e., a transmit clock signal) and to the receive circuit 713 (i.e., a sampling clock signal), separate locked loop circuits may be provided to generate separate transmit and sampling clock signals. Alternatively, multiple clock generation circuits may be provided within the locked loop circuit 709 to generate separate transmit and sampling clock signals. For example, in an embodiment in which locked loop 709 is a DLL circuit implemented as shown in FIG. 7, an additional DRSS mixer and clock tree circuit may be provided to generate a transmit clock in response to a separate offset control value, OCTL. Also, although two ICs are depicted in FIG. 29 (i.e., ICs 701 and 703), the circuits within each of the ICs may alternatively be implemented in a single IC (e.g., in a system-on-chip or similar application), with signal paths 702 and 704 being routed via metal layers or other signal conducting structures fabricated within the IC. Also, if distinct ICs are used as shown in FIG. 29, the ICs may be packaged in separate IC packages (e.g., plastic or ceramic encapsulation, bare die package, etc.) or in a single IC package (e.g., multi-chip module, paper thin package (PTP), etc.).

Although the invention has been described with reference to specific exemplary embodiments thereof, it will be evident that various modifications and changes may be made thereto without departing from the broader spirit and scope of the invention as set forth in the appended claims. For example, although specific circuits have been described and depicted as including metal oxide semiconductor (MOS) transistors, such circuits may alternatively be implemented using bipolar technology or any other technology in which a signal-controlled resistance may be achieved. Also, while CMOS and DRSS signaling levels have been described, any signaling levels having a substantially equal common mode voltage may alternatively be used. Accordingly, the specification and drawings are to be regarded in an illustrative rather than a restrictive sense.

What is claimed is:

1. A system comprising:
 a reference circuit to output reference clock signals in response to at least one input clock signal;
 a voltage regulation circuit to adjust upper and lower supply voltages in response to a phase difference between a predetermined pair of reference clock signals;
 a mixing circuit to receive a selected pair of reference clock signals and an offset control value, the mixing circuit to output a transmit clock signal in response to the selected pair of reference clock signals and the offset control value;
 a transmit circuit to output an output signal in response to the transmit clock signal; and
 a receive circuit to receive the output signal,
 wherein the offset control value corresponds to a distance a clock signal travels from the transmit circuit to the receive circuit.

2. The system of claim 1, wherein the reference circuit, the voltage regulation circuit, and the mixing circuit are included in a master device and the receive circuit is included in an integrated circuit memory device, and wherein the output signal represents write data that is stored in the integrated circuit memory device.

3. The system of claim 1, wherein the master device is a memory controller and the integrated circuit memory device is disposed on a memory module having a plurality of integrated circuit memory devices.

4. The system of claim 2, wherein the master device selects the offset control value according to an intended recipient of the output signal.

5. The system of claim 4, wherein the master device selects the offset control value from a plurality of offset control values corresponding to a plurality of devices.

6. The system of claim 1, wherein the reference circuit includes a plurality of delay elements to generate the reference clock signals, and wherein the voltage control circuit provides the upper supply voltage and the lower supply voltage to each of the delay elements in the plurality of delay elements.

7. The system of claim 1, further comprising:
 a phase detector to receive a feedback signal and the at least one input clock signal, the phase detector to determine a phase relationship between the feedback signal and the at least one input clock signal and to output a mix control signal in response to the phase relationship;
 a counter circuit to output a count value in response to the mix control signal and the offset control value;
 a select circuit to select the selected pair of reference clock signals in response to the count value; and
 a mix amplifier to interpolate between the selected pair of reference clock signals in response to the count value.

8. The system of claim 1, further comprising:
 a reference clock generator to provide the at least one input clock signal.

9. A system comprising:
 a reference circuit to output reference clock signals in response to at least one input clock signal;
 a voltage regulation circuit to adjust upper and lower supply voltages in response to a phase difference between a predetermined pair of reference clock signals;
 a mixing circuit to receive a selected pair of reference clock signals and an offset control value, the mixing circuit to output a receive clock signal in response to the selected pair of reference clock signals and the offset control value;
 a transmit circuit to output an output signal that represents a read command; and a receive circuit to receive read data in response to the receive clock signal, wherein the offset control value corresponds to a distance a clock signal travels from the transmit circuit to the receive circuit.

10. The system of claim 9, wherein the reference circuit, the voltage regulation circuit, and the mixing circuit are included in a memory controller and the receive circuit is included in an integrated circuit memory device disposed on a memory module having a plurality of integrated circuit memory devices.

11. The system of claim 10, wherein the memory controller selects the offset control value according to an intended recipient of the read command.

12. The system of claim 10, wherein the memory controller selects the offset control value from a plurality of offset control values corresponding to the plurality of integrated circuit memory devices, the plurality of offset control values stored at a memory location.

13. The system of claim 9, wherein the reference circuit includes a plurality of delay elements to generate the reference clock signals, and wherein the voltage control circuit provides the upper supply voltage and the lower supply voltage to each of the delay elements in the plurality of delay elements.

14. The system of claim 9, further comprising:
a phase detector to receive a feedback signal and the at least one input clock signal, the phase detector to determine a phase relationship between the feedback signal and the at least one input clock signal and to output a mix control signal in response to the phase relationship;
a counter circuit to output a count value in response to the mix control signal and the offset control value;
a select circuit to select the selected pair of reference clock signals in response to the count value; and
a mix amplifier to interpolate between the selected pair of reference clock signals in response to the count value.

15. A system comprising:
a master device including,
a reference circuit to output reference clock signals in response to at least one input clock signal;
a voltage regulation circuit to adjust upper and lower supply voltages in response to a phase difference between a predetermined pair of reference clock signals;
a mixing circuit to receive a selected pair of reference clock signals, a first offset control value and a second offset control value, the mixing circuit to output a first transmit clock signal in response to the selected pair of reference clock signals and the first offset control value and output a second transmit clock signal in response to the selected pair reference clock signals and the second offset control value;
a transmit circuit to output a first write date in response to the transmit clock signal and a second write data in response to the second transmit clock signal;
a first integrated circuit memory device including,
a receive circuit to receive the first write data; and
a second integrated circuit memory device including,
a receive circuit to receive the second write data,
wherein the first offset control value corresponds to a first distance a clock signal travels from the master device to the first integrated circuit memory device, and the second offset control value corresponds to a second distance the clock signal travels from the master device to the second integrated circuit memory device.

16. The system of claim 15, wherein the first and second integrated circuit memory devices are disposed on a memory module, and wherein first and second distances include a distance of a signal path on the memory module.

17. A system comprising:
a master device including,
a reference circuit to output reference clock signals in response to at least one input clock signal;
a voltage regulation circuit to adjust upper and lower supply voltages in response to a phase difference between a predetermined pair of reference clock signals;
a mixing circuit to receive a selected pair of reference clock signals, a first offset control value and a second offset control value, the mixing circuit to output a first sample clock signal in response to the selected pair of reference clock signals and the first offset control value and output a second sample clock signal in response to the selected pair reference clock signals and the second offset control value;
a receive circuit to receive a first read data in response to the first sampling clock signal and a second read data in response to the second sampling clock signal;
a first integrated circuit memory device including,
a transmit circuit to output the first read data; and
a second integrated circuit memory device including,
a transmit circuit to output the second read data,
wherein the first offset control value corresponds to a first distance a clock signal travels from the master device to the first integrated circuit memory device, and the second offset control value corresponds to a second distance the clock signal travels from the master device to the second integrated circuit memory device.

18. The system of claim 17, wherein the first and second integrated circuit memory devices are disposed on a memory module, and wherein first and second distances include a distance of a signal path on the memory module.

* * * * *